(12) United States Patent
Tuers et al.

(10) Patent No.: US 9,384,128 B2
(45) Date of Patent: Jul. 5, 2016

(54) MULTI-LEVEL REDUNDANCY CODE FOR NON-VOLATILE MEMORY CONTROLLER

(71) Applicant: SanDisk Technologies Inc., Plano, TX (US)

(72) Inventors: Daniel Tuers, Kapaa, HI (US); Abhijeet Manohar, Karnataka (IN)

(73) Assignee: SanDisk Technologies, Inc., Plano, TX (US)

( * ) Notice: Subject to any disclaimer, the term of this patent is extended or adjusted under 35 U.S.C. 154(b) by 74 days.

(21) Appl. No.: 14/256,268

(22) Filed: Apr. 18, 2014

(65) Prior Publication Data

US 2015/0301933 A1    Oct. 22, 2015

(51) Int. Cl.
*G06F 12/02* (2006.01)
*H03M 13/05* (2006.01)
*G06F 11/10* (2006.01)

(52) U.S. Cl.
CPC ........ *G06F 12/0246* (2013.01); *G06F 11/1048* (2013.01); *H03M 13/05* (2013.01); *G06F 2212/1032* (2013.01)

(58) Field of Classification Search
CPC .................................................. G06F 11/1068
USPC ............................ 714/763, 773, 766, 705, 42
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |

(Continued)

FOREIGN PATENT DOCUMENTS

| | | |
|---|---|---|
| CN | 1822207 A | 8/2006 |
| CN | 101162449 A | 4/2008 |

(Continued)

OTHER PUBLICATIONS

Eitan et al., "NROM: A Novel Localized Trapping, 2-Bit Nonvolatile Memory Cell," *IEEE Electron Device Letters*, vol. 21, No. 11, Nov. 2000, pp. 543-545.

(Continued)

*Primary Examiner* — Fritz Alphonse
(74) *Attorney, Agent, or Firm* — Sterne, Kessler, Goldstein & Fox PLLC

(57) ABSTRACT

In the controller circuit of a non-volatile memory system, data is protected by CRC (cyclic redundancy code) between functional blocks of the controller: Before a data set is transmitted from one functional block (such the host interface) to another functional block (such as data encryption or ECC), corresponding CRC is generated and transferred with the data. At the second block, the data set can be checked with the CRC at the second block before it operates on the data. This allows the controller to check for internal transfer errors early, allow for corrupted data to be re-requested, such as from a host when this process is applied to a data write operation. After the second block finishes with the data, a new CRC can then be generated to protect the data on its next internal transfer. This arrangement can particularly useful for functional blocks that transform the data set.

41 Claims, 21 Drawing Sheets

(56) References Cited

U.S. PATENT DOCUMENTS

| | | |
|---|---|---|
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 6,252,731 B1 | 6/2001 | Sloan et al. |
| 6,397,313 B1 | 5/2002 | Kasa et al. |
| 6,510,488 B2 | 1/2003 | Lasser |
| 6,873,939 B1 | 3/2005 | Zerbe et al. |
| 6,996,740 B2 | 2/2006 | Roe |
| 7,057,939 B2 | 6/2006 | Li et al. |
| 7,058,818 B2 | 6/2006 | Dariel |
| 7,246,274 B2 | 7/2007 | Kizer et al. |
| 7,310,347 B2 | 12/2007 | Lasser |
| 7,376,034 B2 | 5/2008 | Torabi et al. |
| 7,426,623 B2 | 9/2008 | Lasser |
| 7,472,318 B2 | 12/2008 | Fan et al. |
| 7,480,766 B2 | 1/2009 | Gorobets |
| 7,492,807 B1 | 2/2009 | Buchmann et al. |
| 7,493,457 B2 | 2/2009 | Murin |
| 7,502,254 B2 | 3/2009 | Murin et al. |
| 7,613,931 B2 | 11/2009 | Tonami et al. |
| 7,765,339 B2 | 7/2010 | Salessi et al. |
| 8,464,135 B2 | 6/2013 | Erez et al. |
| 2002/0066052 A1 | 5/2002 | Olarig et al. |
| 2002/0069318 A1 | 6/2002 | Chow et al. |
| 2005/0154819 A1 | 7/2005 | Conley et al. |
| 2005/0162948 A1 | 7/2005 | Swanson et al. |
| 2005/0166110 A1 | 7/2005 | Swanson et al. |
| 2005/0213393 A1 | 9/2005 | Lasser |
| 2005/0268181 A1 | 12/2005 | Murty et al. |
| 2007/0061502 A1 | 3/2007 | Lasser et al. |
| 2007/0061581 A1 | 3/2007 | Holtzman et al. |
| 2007/0061597 A1 | 3/2007 | Holtzman et al. |
| 2007/0065119 A1 | 3/2007 | Pomerantz |
| 2007/0089035 A1 | 4/2007 | Alexander et al. |
| 2007/0091677 A1 | 4/2007 | Lasser et al. |
| 2007/0094459 A1 | 4/2007 | Suzuki et al. |
| 2007/0113030 A1 | 5/2007 | Bennett et al. |
| 2007/0136623 A1 | 6/2007 | Perego et al. |
| 2007/0180346 A1 | 8/2007 | Murin |
| 2007/0220197 A1 | 9/2007 | Lasser |
| 2007/0226592 A1* | 9/2007 | Radke .................. H03M 13/05 714/766 |
| 2007/0260808 A1 | 11/2007 | Raines et al. |
| 2007/0268745 A1 | 11/2007 | Lasser |
| 2007/0271495 A1 | 11/2007 | Shaeffer et al. |
| 2007/0283081 A1 | 12/2007 | Lasser |
| 2008/0104312 A1 | 5/2008 | Lasser |
| 2008/0112255 A1 | 5/2008 | Nygren |
| 2008/0155176 A1 | 6/2008 | Sinclair et al. |
| 2008/0155177 A1 | 6/2008 | Sinclair et al. |
| 2008/0155178 A1 | 6/2008 | Sinclair et al. |
| 2008/0155227 A1 | 6/2008 | Sinclair et al. |
| 2008/0155228 A1 | 6/2008 | Sinclair et al. |
| 2008/0181000 A1 | 7/2008 | Lasser |
| 2008/0244338 A1 | 10/2008 | Mokhlesi et al. |
| 2008/0244367 A1 | 10/2008 | Chin et al. |
| 2008/0250300 A1 | 10/2008 | Mokhlesi et al. |
| 2009/0094482 A1 | 4/2009 | Zilberman |
| 2009/0155175 A1 | 6/2009 | Alt |
| 2009/0271678 A1 | 10/2009 | Schneider et al. |
| 2009/0321530 A1 | 12/2009 | Harari et al. |
| 2010/0005219 A1 | 1/2010 | Loughner et al. |
| 2010/0005375 A1 | 1/2010 | Dell et al. |
| 2011/0161784 A1 | 6/2011 | Selinger et al. |
| 2012/0266048 A1 | 10/2012 | Chung et al. |
| 2013/0297986 A1* | 11/2013 | Cohen .................. G06F 3/061 714/763 |
| 2013/0318289 A1* | 11/2013 | Tomlin .................. G06F 3/061 711/103 |

FOREIGN PATENT DOCUMENTS

| | | |
|---|---|---|
| EP | 1253521 A2 | 10/2002 |
| WO | WO 2010/078383 A1 | 7/2010 |

OTHER PUBLICATIONS

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Having Flush/Eviction Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 61/142,620 entitled "Non-Volatile Memory and Method With Improved Block Management System," filed Jan. 5, 2009, 144 pages.

U.S. Appl. No. 12/642,584 entitled "Maintaining Updates of Multi-Level Non-Volatile Memory in Binary Non-Volatile Memory," filed Dec. 18, 2009, 76 pages.

U.S. Appl. No. 12/642,611 entitled "Non-Volatile Memory with Multi-Gear Control Using On-Chip Folding of Data," filed Dec. 18, 2009, 74 pages.

U.S. Appl. No. 12/642,649 entitled "Data Transfer Flows for On-Chip Folding," filed Dec. 18, 2009, 73 pages.

U.S. Appl. No. 12/642,728 entitled "Non-Volatile Memory and Method With Post-Write Read and Adaptive Re-Write to Manage Errors," filed Dec. 18, 2009, 70 pages.

U.S. Appl. No. 12/642,740 entitled "Non-Volatile Memory and Method With Atomic Program Sequence and Write Abort Detection," filed Dec. 18, 2009, 60 pages.

Park et al, "A High Performance Controller for NAND Flash-based Solid State Disk (NSSD)" *Samsung, Non-volatile Semiconductor Workshop*, 2006, IEEE, NVSMW 2006, 21$^{st}$, vol. No., pp. 17-20, Feb. 12-16, 2006.

Cha et al., Single_Error_Correction and Double_Adjacent_Error_Correction Code for Simultaneous Testing of Data Bit and Check Bit Arrays in Memories, IEEE Transactions on Device and Materials Reliability, vol. 14, No. 1, Mar. 2014, pp. 529-535.

\* cited by examiner

Programming into Four States Represented by a 2-bit Code

MULTI-LEVEL REDUNDANCY CODE FOR NON-VOLATILE MEMORY CONTROLLER

BACKGROUND

This application relates to the operation of re-programmable non-volatile memory systems, such as semiconductor flash memory, and, more specifically, to reducing error in the memory system's controller and memory circuits.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

As noted above, non-volatile memory devices are commonly formed of a controller circuit and one or more memory chips connected to each other over a bus structure. In order to return user data to a host device uncorrupted, error needs to be avoided through then whole of the data path from the host, through the controller, onto the memory array and back.

SUMMARY OF THE INVENTION

According to general aspects of the invention, a non-volatile memory system is presented. The non-volatile memory system has one or more non-volatile memory circuits and a controller circuit having a plurality of functional blocks. These functional blocks include: a host interface, through which the memory system is connectable to a host for the transfer of user data between them; a memory interface, through which the controller circuit is connected to one or more of the memory circuits for the transfer of user data; and one or more intermediate blocks through which data passes when being transferred between the host and memory interfaces. When transferring a data set from a first of the functional blocks through a second of the functional blocks, prior to transmitting the data set the first functional block generates a first associated redundancy code that is transmitted with the data set. After receiving the data set and first associated redundancy code at the second functional block, and prior to operating on the data set, the second functional block checks the integrity of the data set using the first associated redundancy code. Subsequent to operating on the data set in the second functional block and prior to transmitting the data set, the second functional block generates a second associated redundancy code that is transmitted with the data set.

In other aspects, methods of operating a controller circuit in a non-volatile memory system are presented, where the memory controller has a plurality of functional blocks including a host interface, a memory interface, and one or more intermediate blocks through with data passes when transferred between the host and memory interfaces. At a first of the functional blocks, a first associated redundancy code for a data set is generated and transmitted to a second of the functional blocks. The data set and the first associated redundancy code are received at the second functional blocks and the integrity of the data set is checked using the first associated redundancy code. The second functional block subsequently operates on the data set, generates a second associated redundancy code for the data set, and transmits the data set and the second associated redundancy code.

Still further aspects relate to a controller circuit for a non-volatile memory system. The controller circuit has a plurality of functional blocks including: a host interface through which the memory system is connectable to a host for the transfer of user data; a memory interface through which the controller circuit is connectable to one or more of the memory circuits for the transfer of user data; and one or more intermediate blocks through which data passes when being transferred between the host and memory interfaces. When transferring a data set from a first of the functional blocks through a second of the functional blocks, prior to transmitting the data set therefrom the first functional block generates a first associated redundancy code that is transmitted with the data set. After receiving the data set and first associated redundancy code at the second functional block and prior to operating on the data set, the second functional block checks the integrity of the data set using the first associated redundancy code. Subsequent to operating on the data set in the second functional block and prior to transmitting the data set, the second functional block generates a second associated redundancy code that is transmitted with the data set.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

FIG. 1 to FIG. 7 provide example memory systems in which the various aspects of the present invention may be implemented or illustrated.

Figure 8:
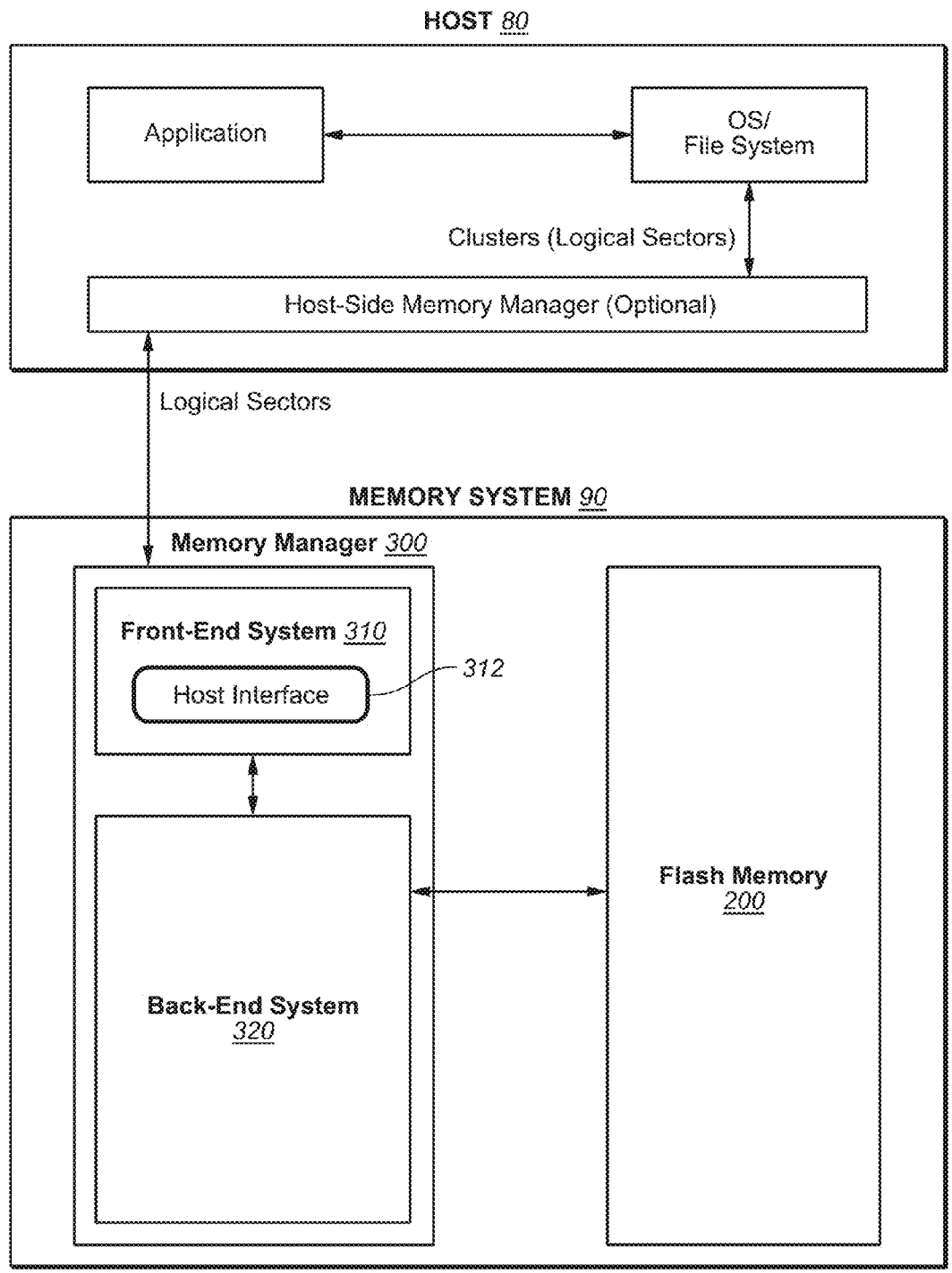
FIG. 8 illustrates the memory being managed by a memory manager with is a software component that resides in the controller.
Figure 9:
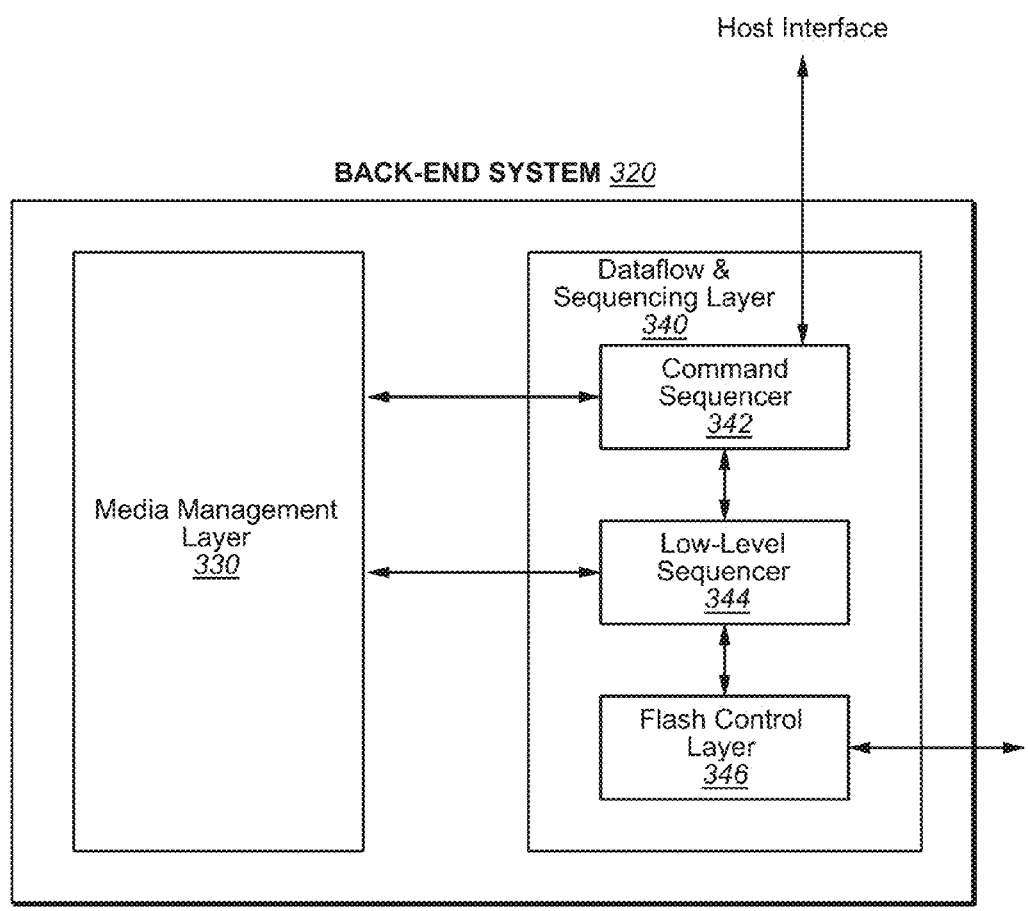
FIG. 9 illustrates the software modules of the back-end system.

FIG. 8 to FIG. 10 illustrate preferred memory and block architectures for implementing the various aspects of the present invention.

Figure 11:
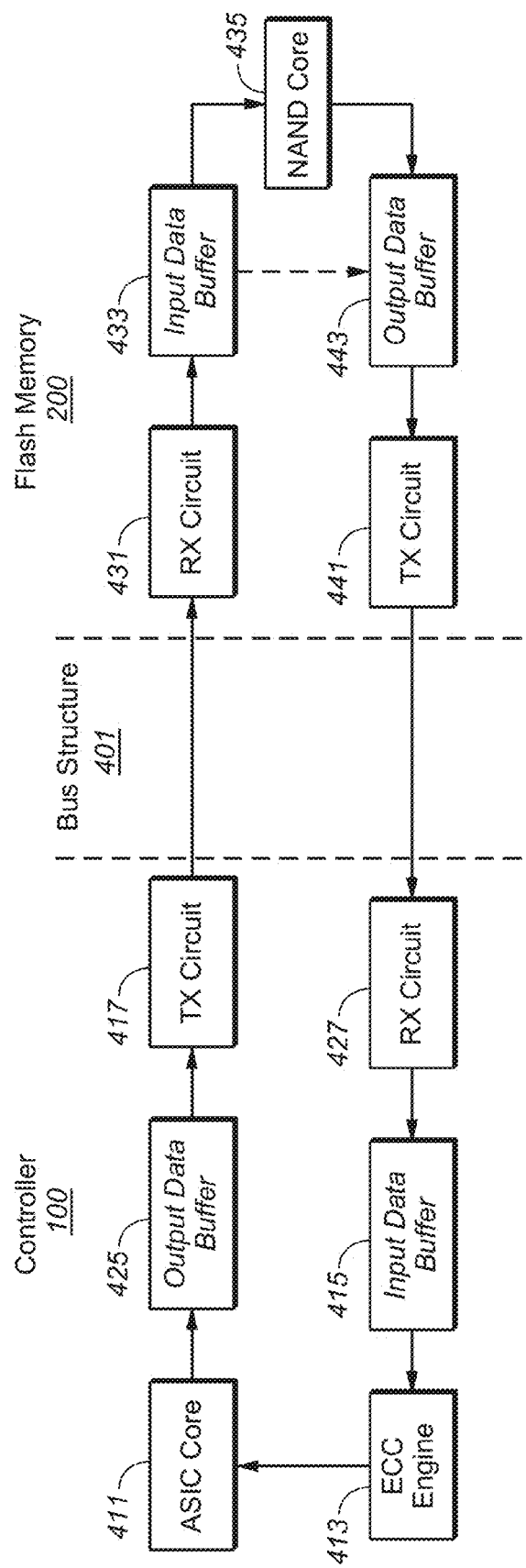
FIG. 11 is a block diagram showing a feedback mechanism for determining interface integrity based on an existing infrastructure.
Figure 12:
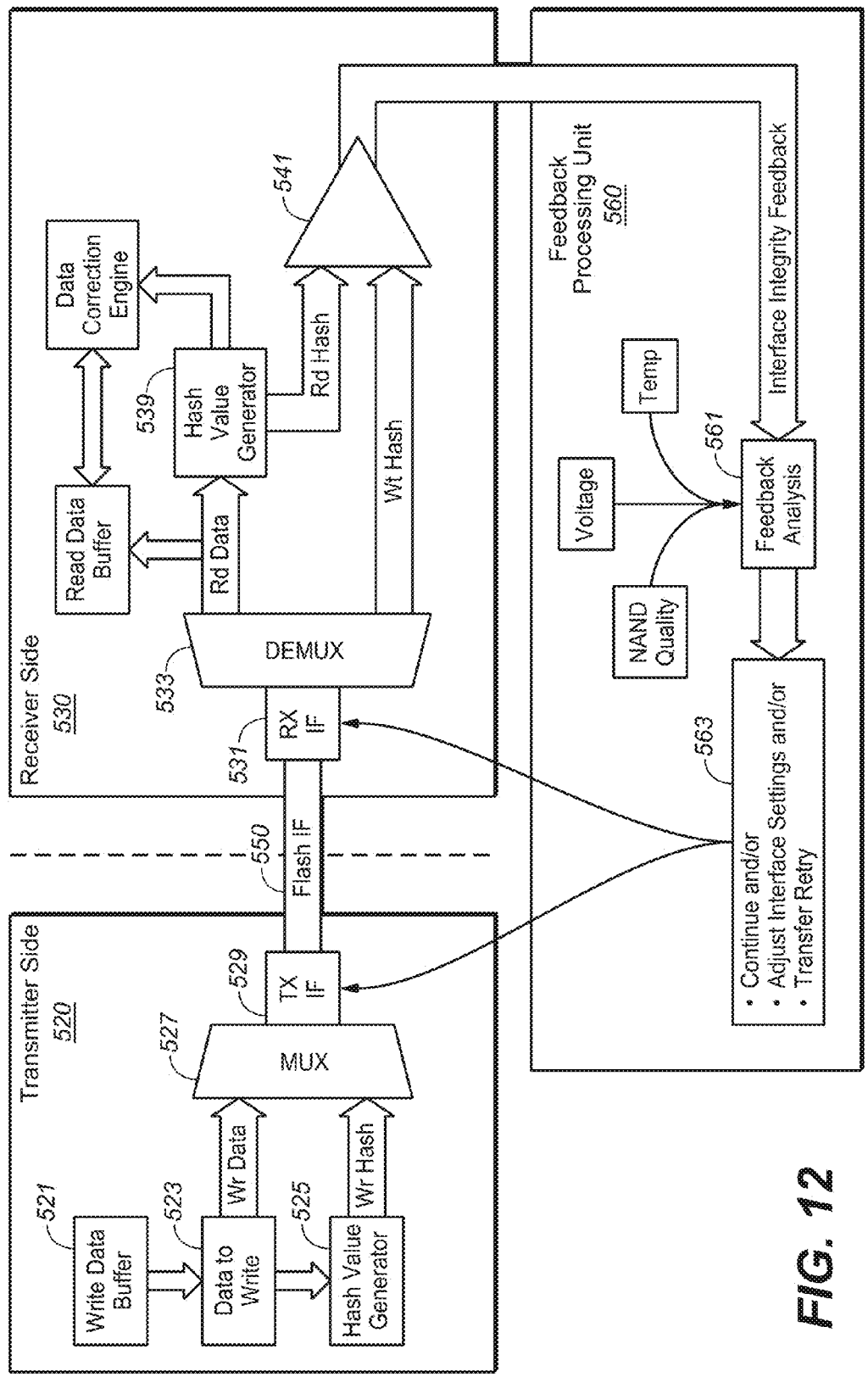
FIG. 12 is a block diagram illustrating embodiments where the feedback mechanism uses a hash engine to determine interface integrity.
Figure 13:
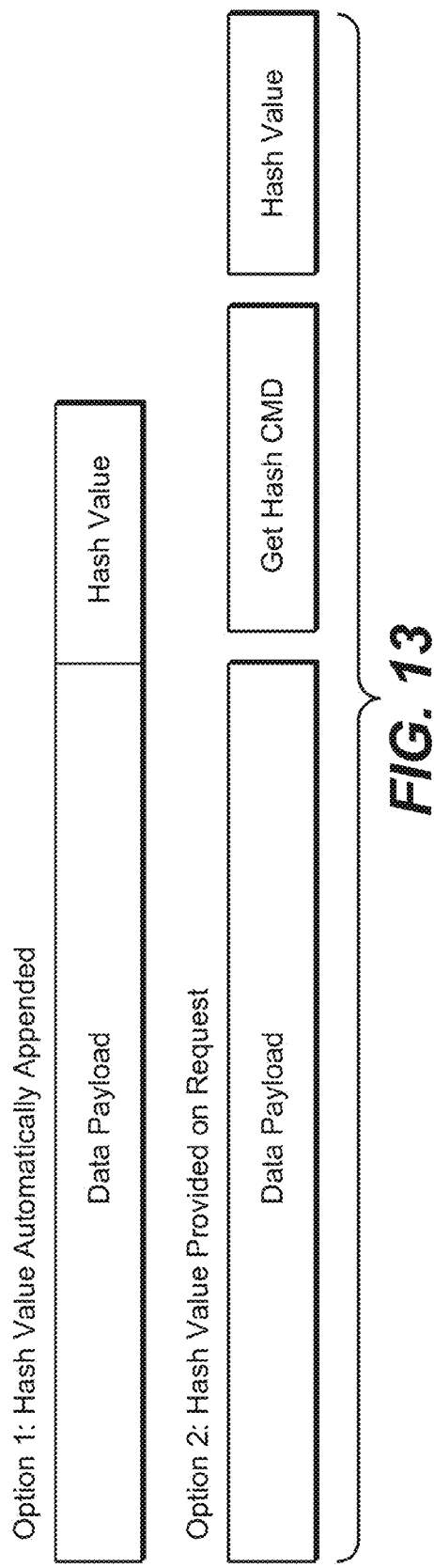
FIG. 13 is a diagram showing an example for transmitting the data and the generated hash value over the bus interface.

FIGS. 11-13 illustrate the use of an adaptive internal interface between the controller and the memory circuit or circuits.

Figure 1:
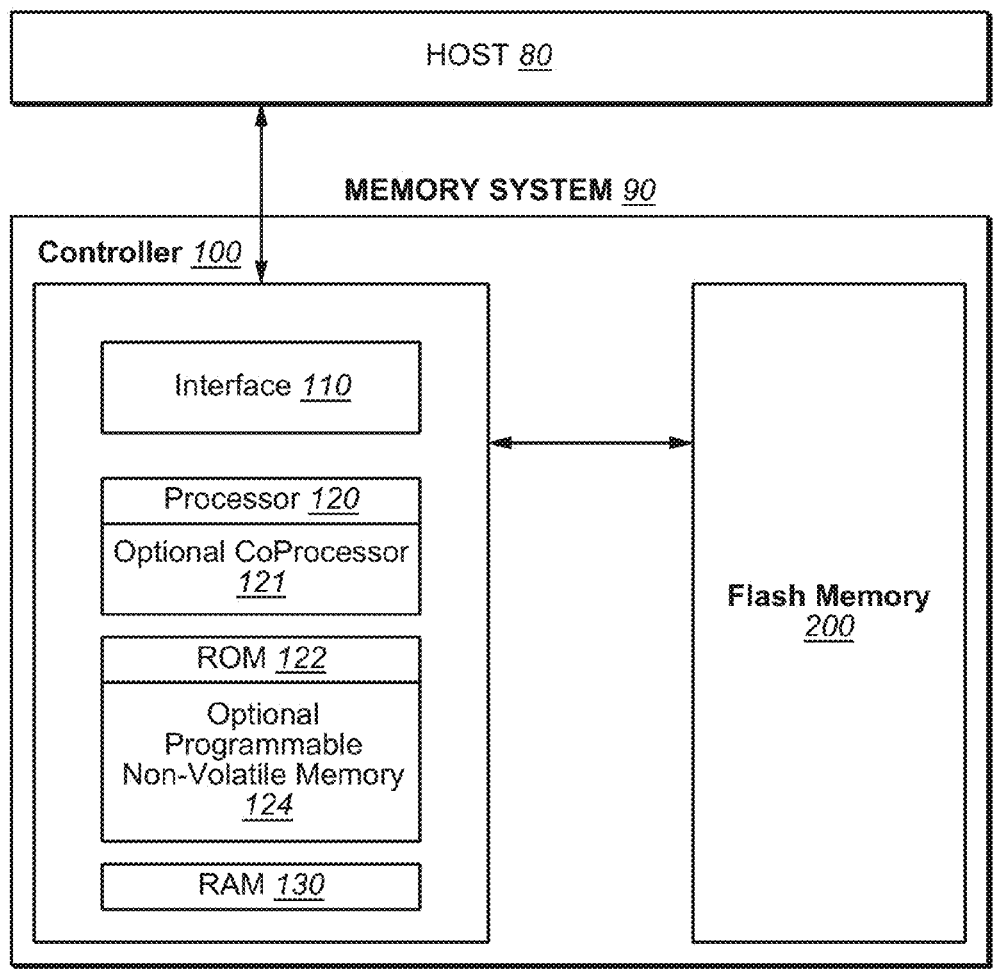
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
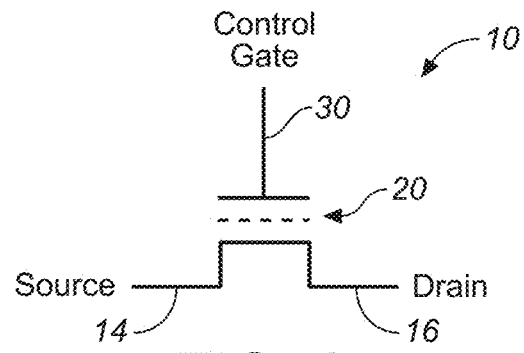
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935, Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
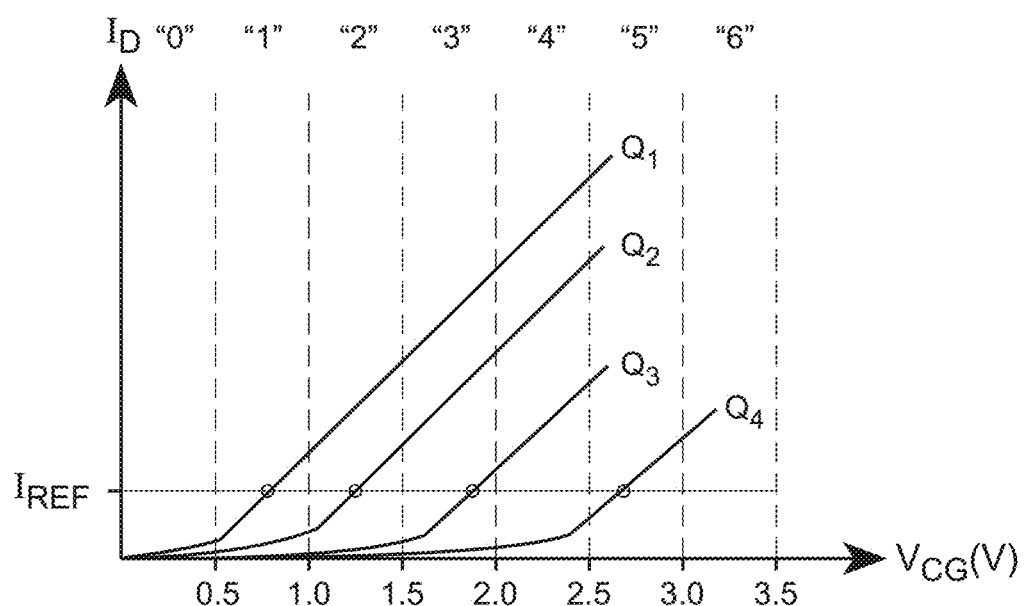
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Referring back to the memory system 90 and the array 200 of FIG. 1, generally Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

Figure 4A:
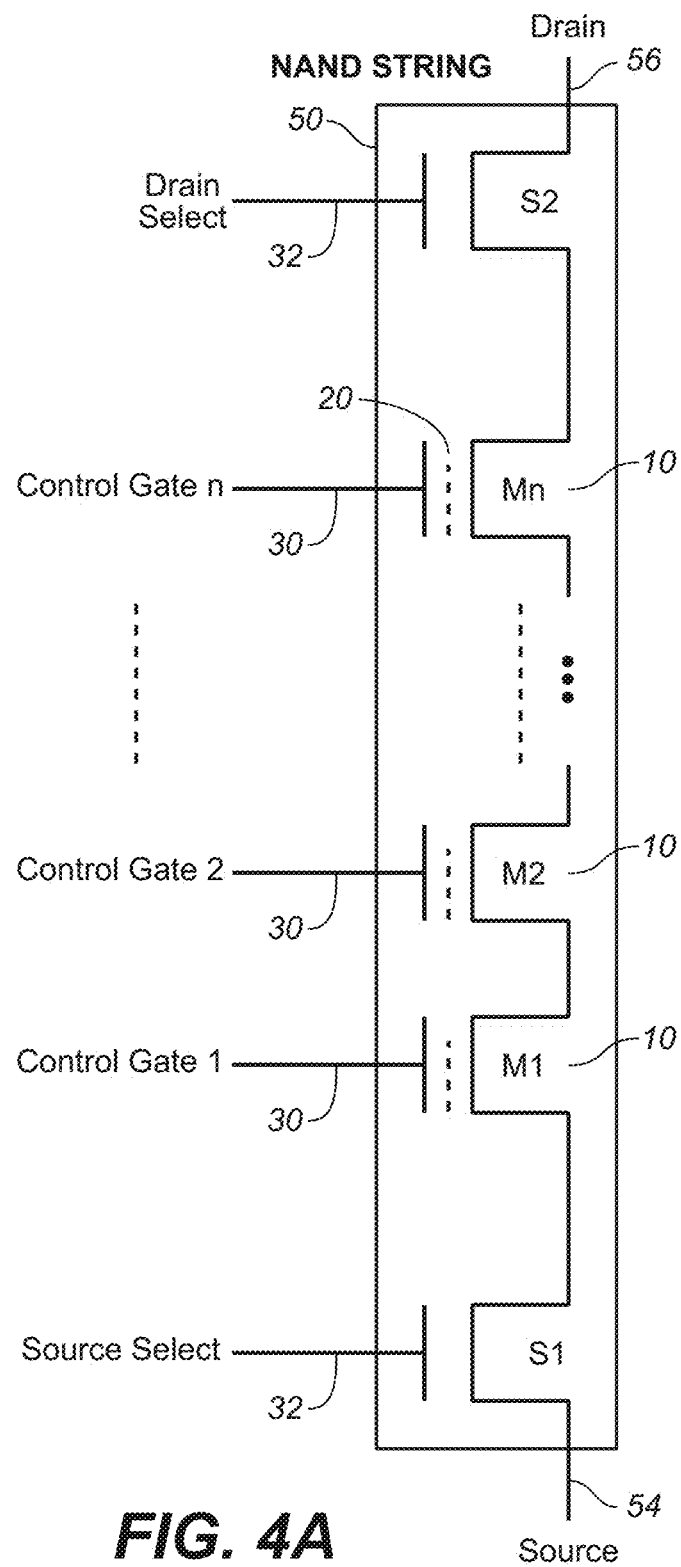
FIG. 4A illustrates schematically a string of memory cells organized into an NAND string.

FIG. 4A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
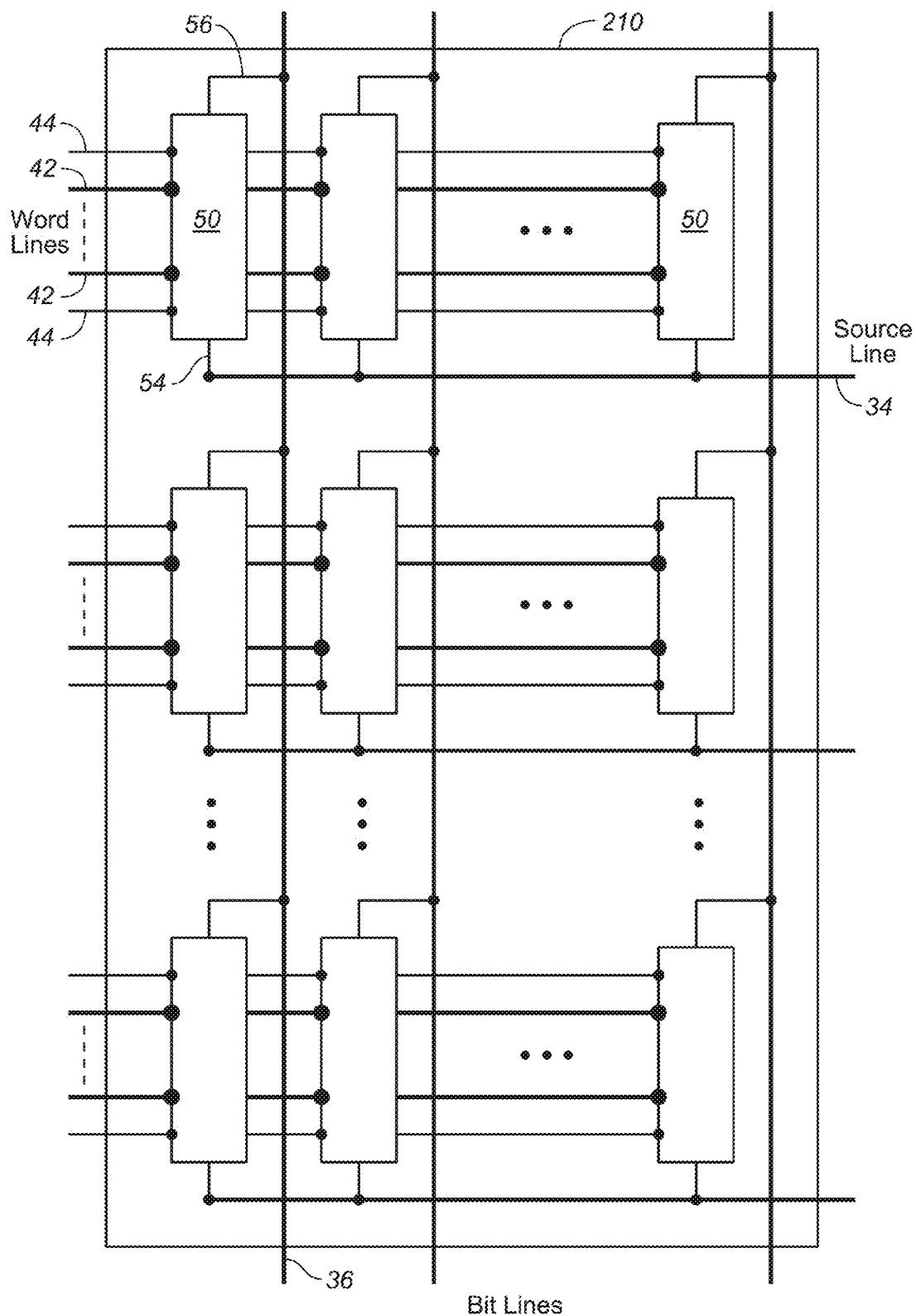
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
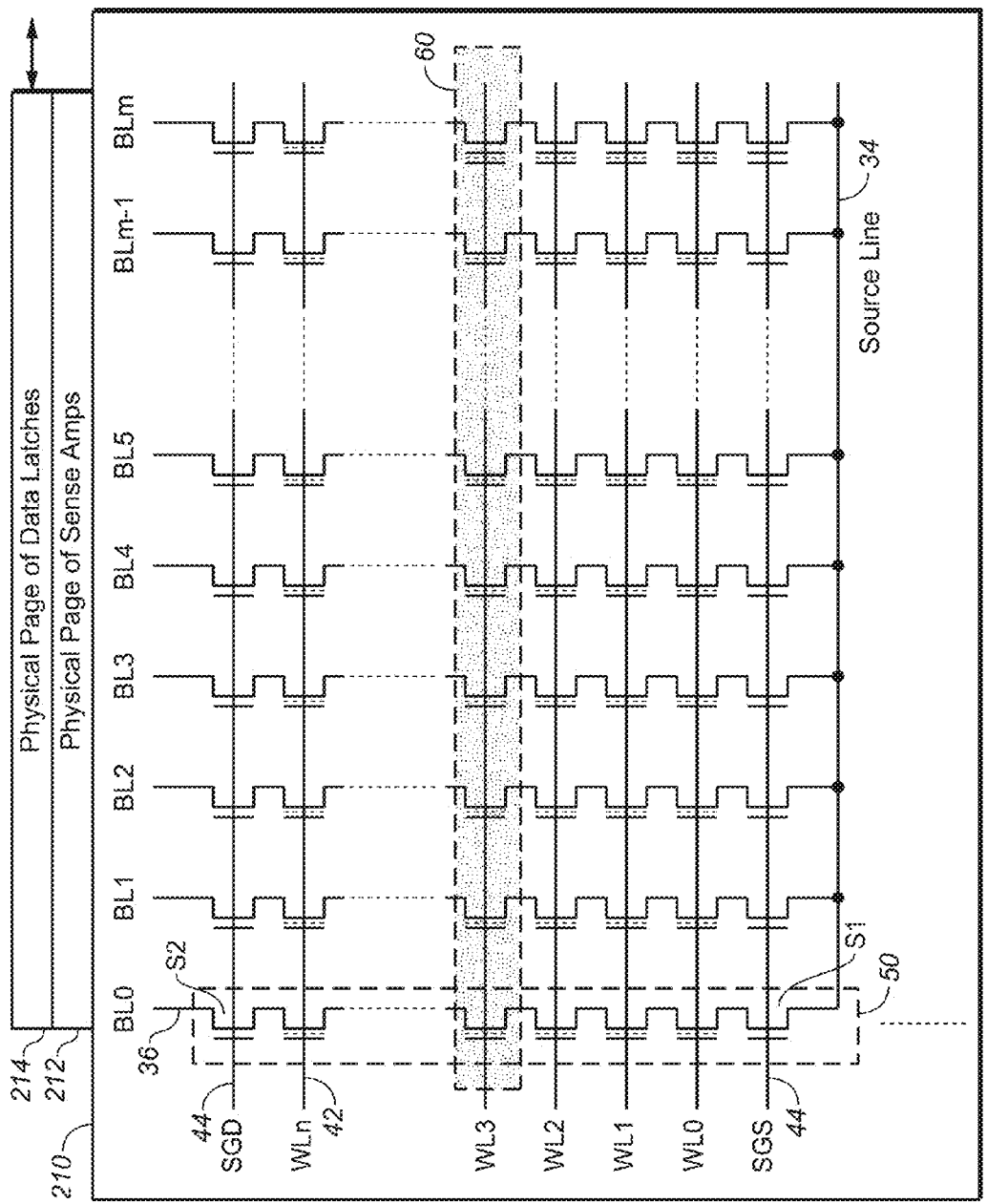
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
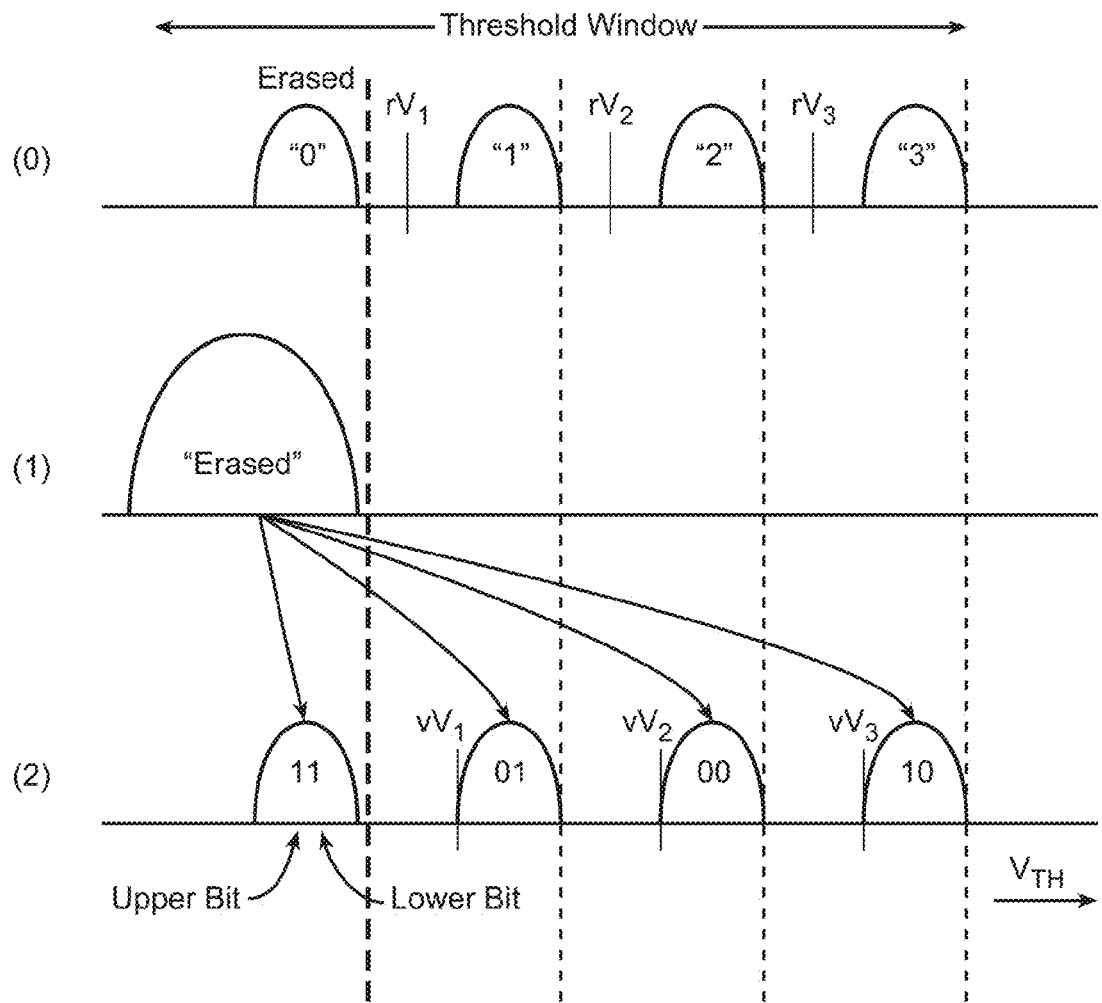
FIGS. 6(0)-6(2) illustrate an example of programming a population of 4-state memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
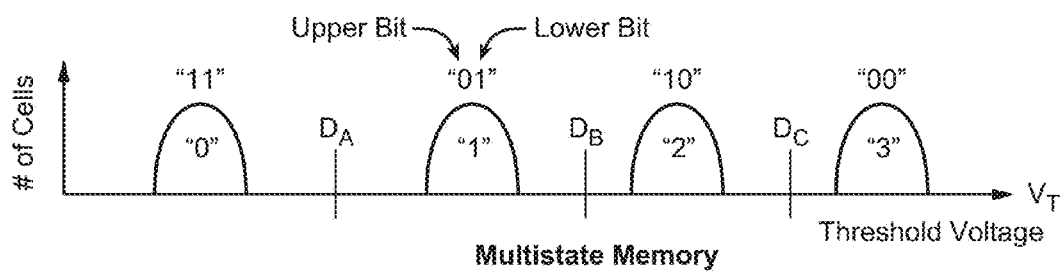
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
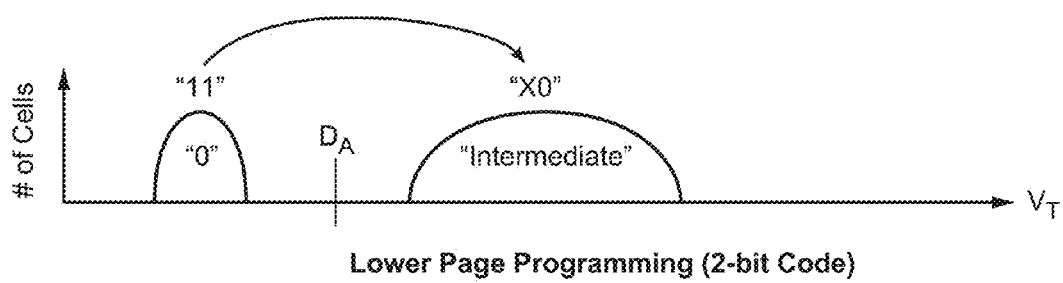

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
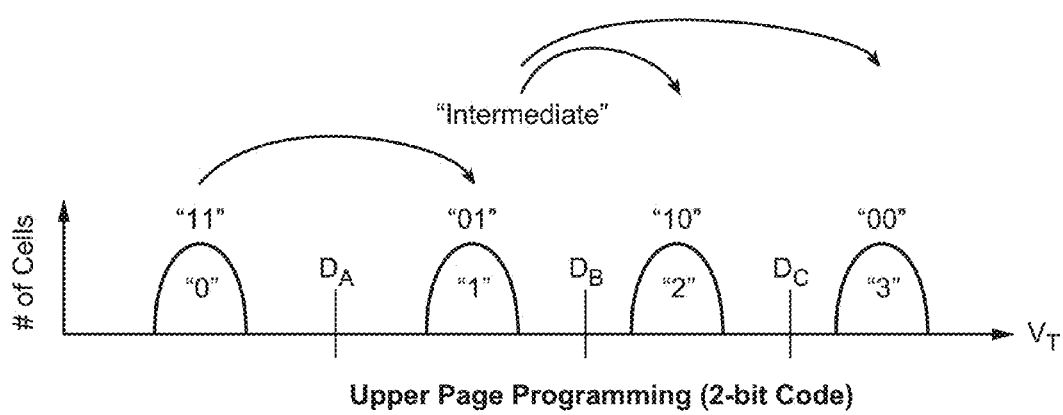

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
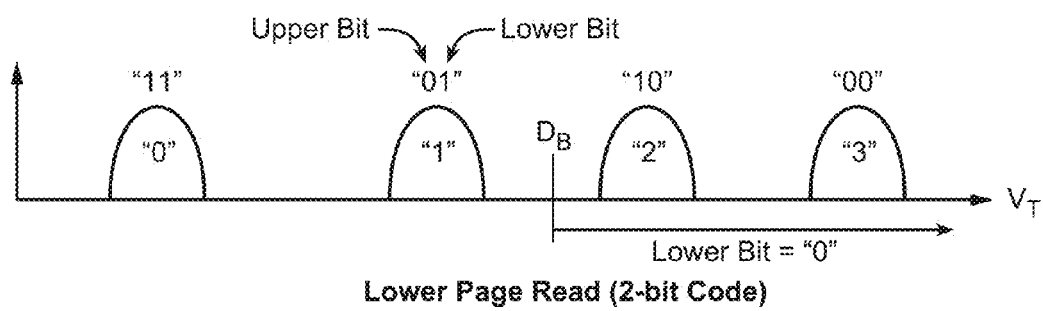

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
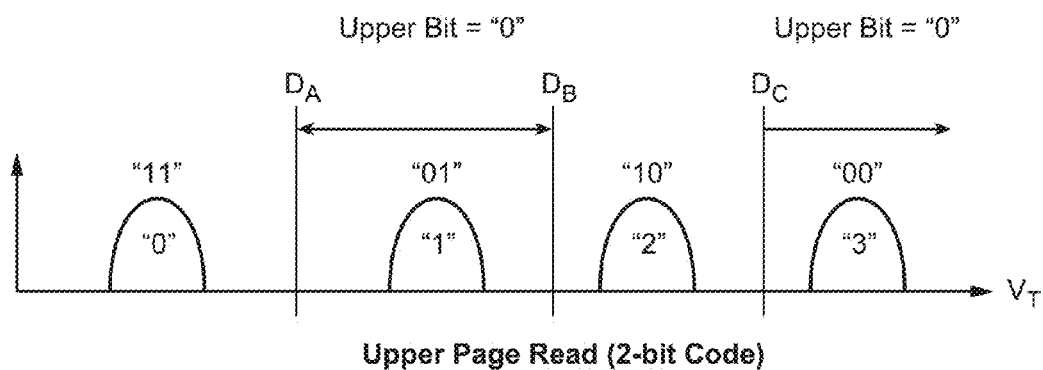

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the ease the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

FIG. 8 illustrates the memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
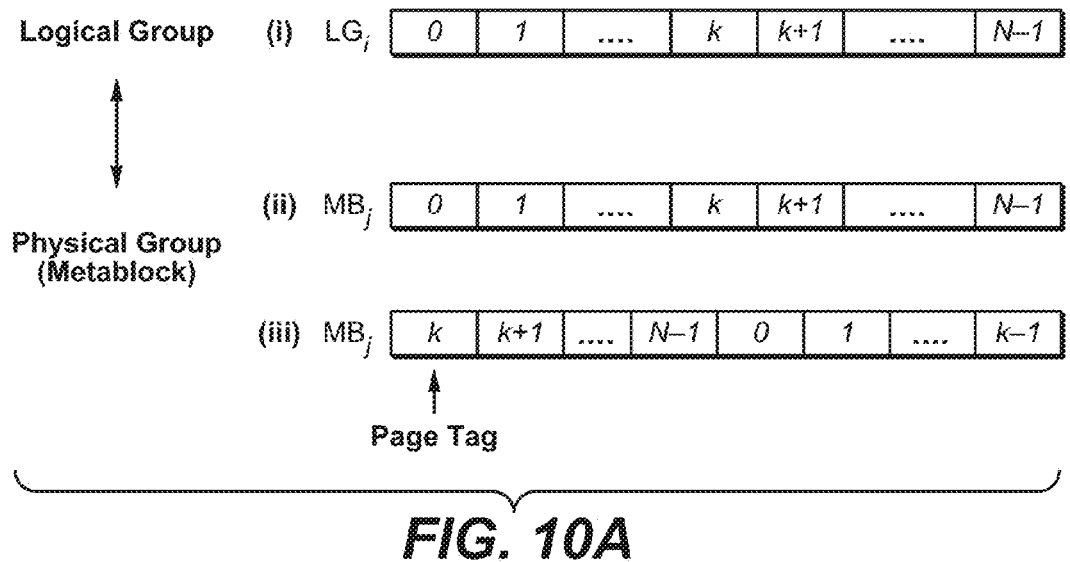
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, . . . , N-1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N-1 is reached, it wraps around to sector 0 and finally storing data associated with logical sector k-1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
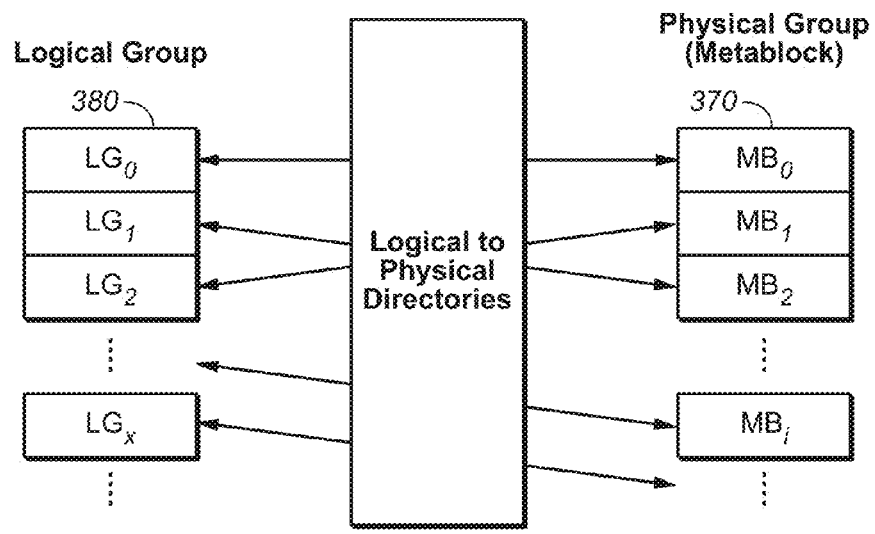
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Adaptive Controller-Memory Interface

This section presents the use of a feedback mechanism and processing unit that monitors transfer integrity of the internal controller-memory interface of the memory system and can adjust the interface settings accordingly. This allows for system to optimize interface performance. For example, the system's power may be able be reduced or the bus clock for the interface sped up, which, as this can often be an internal performance bottleneck, allows for an increase in performance as seen from outside of the memory system (i.e., from the host). In case of transmission errors, assisted by the interface integrity feedback and, depending on the embodiment, other sensors or parameters, the feedback processing unit can decide whether to adjust the interface settings, perform a transmission retry or to ignore the error. The discussion below will also be given in the context of a memory card using a NAND-type architecture for memory arrays as shown in FIGS. 4A, 4B and 5, but readily extends to similar internal interfaces for other architectures, other forms of memory and non-card uses, such as embedded systems, SSD, and so on.

Although the following discussion may be based on various exemplary embodiments to provide concrete examples, the techniques and structures here can be applied fairly generally to memory systems having a controller and multiple banks that can independently operate, where the banks include some amount of non-volatile memory, whether flash or other variety, that can be used to store system data that the controller can use to manage the memory system. In addition to the other referenced cited above, theses can include the various memory systems presented in the following US patent, patent publication and application numbers: U.S. Pat. No. 7,480,766; US-2005-0154819-A1; US-2007-0061581-A1; US-2007-0061597-A1; US-2007-0113030-A1; US-2008-0155178-A1; US-2008-0155228-A1; US-2008-0155176-A1; US-2008-0155177-A1; US-2008-0155227-A1; US-2008-0155175-A1; U.S. Ser. Nos. 12/348,819; 12/348,825; 12/348,891; 12/348,895; 12/348,899; 12/642,584; 12/642,611; U.S. Ser. Nos. 12/642,649; 12/642,728; 12/642,740; and 61/142,620.

Before discussion of the exemplary embodiment, this section will begin by further considering the problem being addressed. The controller-memory device interface is used to transfer data between a controller (100, FIG. 1) and one or more NAND (in the exemplary embodiment) devices (200, FIG. 1). (Note that this discussion relates to the internal interface on the memory system 90 between the controller 100 and the Flash memory 200, whereas the interface 110 is the host interface that the controller uses for communication with outside of the memory system.) Different NAND interface modes have been developed to increase the interface performance trading off speed, power consumption, and so on. As this interface is often a performance bottleneck, these interfaces are pushed to the limits to maximize system performances. To avoid data error, interface settings (such as voltage, frequency, drive strength and slew rate control) are being set for worst case scenario (extreme temperatures, extreme load capacitances, extreme voltages, and so on). Consequently, devices are typically designed to have worst-case safety margins, which translates to big margins in typical conditions. In such typical conditions the interface settings can be optimized to much higher interface performances without compromising the product reliability. Without a mechanism such as is presented in the following, memory devices will continue to operate in the worst-case performances settings.

For example, a simple comparison between the burst data transfer times for a 16-bit Normal Mode at the nominal bus frequency of 33 MHz to the accelerated 40 MHz, to the hyper-accelerated 50 MHz and the super hyper-accelerated 60 MHz yields significant latency reductions of about 17%, 33% and 45%, respectively This is shown in Table 1, where the columns are the frequency, corresponding cycle ($t_{cyc}$), time transfer 2142 Bytes of data, and speed ratio relative to that at 33 MHz.

TABLE 1

| Freq | $t_{cyc}$ | 2142B xfr time | Ratio |
| --- | --- | --- | --- |
| 33 MHz | 30.3 ns | 32454.5 ns | 1.00 |
| 40 MHz | 25.0 ns | 26775.0 ns | 0.83 |
| 50 MHz | 20.0 ns | 21420.0 ns | 0.66 |
| 60 MHz | 16.7 ns | 17850.0 ns | 0.55 |

In the prior art, Flash interface performance is typically set to a fixed performance for a given product. The design then takes into account the worst-case design. In some products, the Flash interface is designed for a "close to worst-case", allowing some interface performance optimization, but at the risk for some lower device yield or increased data error.

This section presents a feedback mechanism and processing unit that monitors the interface transfer integrity and adjusts the interface settings accordingly in order to optimize interface performance. In case of transmission errors, the feedback processing unit (assisted by the interface integrity feedback and possibly by other sensors or parameters) can decide whether to adjust the interface settings, perform a transmission retry or to ignore the error. In case of no transmission errors, the feedback processing unit may decide to leave interface settings as they are or modify interface settings in order increase the interface performance. Additionally, the interface integrity feedback mechanism can be designed in such a way that the feedback processing unit can get different grades of information, such as a binary pass/fail indication, a pass/fail plus number of errors, or a pass/fail plus number of errors plus error locations.

According to the embodiment, the feedback mechanism can utilize existing device infrastructure or be further optimized by dedicated mechanism such as hash engine. Such dedicated mechanism may be implemented in hardware, software, or a combination of these. The hash engine may also be complemented by an error correction engine capable of correcting transmission errors. Such method would allow the interface to cope with a level of bit error rate, while still reaching optimal performance. Transmission correction ability is valuable because the design of ECC in the prior art for NAND bit failures only considers errors on the memory itself, and does not take into account the interface errors that may occur as the data is transferred between the controller and the memory device. As interface performance goes up the likelihood of transmission errors goes up. Having the legacy ECC to deal with interface errors degrade the legacy ECC capabilities in terms of performance and probability for unrecoverable error. Designing a dedicated interface error correction engine can allow for a "divide and rule", letting the legacy ECC to focus only on the NAND generated errors. (Additional background detail on ECC can be found in the following US patents, patent publications, and patent application numbers: 2009/0094482; U.S. Pat. No. 7,502,254; 2007/0268745; 2007/0283081; U.S. Pat. Nos. 7,310,347; 7,493,457; 7,426,623; 2007/0220197; 2007/0065119; 2007/0061502; 2007/0091677; 2007/0180346; 2008/0181000; 2007/0260808; 2005/0213393; U.S. Pat. Nos. 6,510,488; 7,058,818; 2008/0244338; 2008/0244367; 2008/0250300; and 2008/0104312.)

FIG. 11 is a block diagram showing such a feedback mechanism, but based on a typical prior art existing NAND/controller infrastructure. This will help to further illustrate some of the concepts involved as well as providing an alternate embodiment of an adaptive interface. In FIG. 11 only the elements relevant to the present discussion are explicitly shown, the other being suppressed to simply the present discussion. On the controller 100 are the ASIC core 411, ECC circuitry 413, an output buffer 415, an input buffer 425, transmitting circuitry 417, and receiving circuitry 427. Although shown as separate here, this may not be so in an actual implementation: the input and output buffers may be overlap or be the same; the transmitting and receiving be share elements of even be the same; the ECC circuitry may be implemented as software in the ASIC core; and so on. On the memory side 200, the shown elements are read circuitry 431 and transfer circuitry 441 (which again may partially or completely overlap), an input data buffer 433 and an output data buffer 443 (which may similarly be a single buffer) and NAND core 435. The controller 100 and the memory circuit are then connected by the bus structure 401.

A typical flow for a set of host data once it is received at the controller 100 is from the ASIC core 411 to the output data buffer 415, through the transmission circuitry 417 and onto the bus structure 401. On the memory 200 the data is transferred from the bus by the receiving circuitry 431 into the input data buffer 433 and then written into the NAND core 435. Subsequently, when the host wants to access the data it is read out of the NAND core 435 to the output data buffer 443, transferred onto the bus structure 401 by the transmission circuitry 441, and then read off the bus into the controller's input data buffer 425 by the receiving circuitry 427. Memory systems typically use error correction code (ECC) to detect and correct for error that may enter the data, where the controller generates the corresponding ECC that is transmitted and written into the NAND core along with the data and then read back with the data. The ECC engine 413 then has access to the data and its corresponding ECC, allowing the data to be checked and corrected as needed before it is passed on to the host.

Although the ECC can be used to correct data error, it can only correct a limited amount of error, where the amount is a design choice. Within these capabilities, the ECC engine 413 can correct for any error accumulated during the round trip, including transmission errors as well as error associated with the NAND core 435 itself, such as write error, read error and disturbs and other degradation of the data while stored; however the choice of ECC is usually based just on considerations of error related to the NAND core 435. In some arrangements, such as with "strong ECC" as disclosed in some of the references cited above for ECC, the code is based on the properties of the memory and how the data states are mapping into the memory. The transmission between the controller and memory is largely overlooked and taken to add no error. Accordingly, the interface needs to be set accordingly, leading the parameters to be set according to the worst, or near worst, case, as described above.

A first set of embodiments is based on the elements of FIG. 11 to supply the feedback used to optimize the interface characteristics. A set of data, along with corresponding ECC, is sent on a round trip from the control to the memory and back to the controller, much as with the standard write followed by a read described above, except that the data (and corresponding ECC) are not actually written into the memory core. After a write transfer is being issued from the controller 100 to the memory circuit 200, the controller can use the buffer latches 433 and 443 to read back the data. This is represent by the path 437, although if the input and output buffers are the same, there would not be an actual transfer. As this round trip removes any error associated with the array of 435 itself, this isolates the effects of the transmission and allows the ECC engine 413 to determine the memory interface's integrity. The interface parameters may then be modified and the process can be re-issued. This way both the write and read interface parameters may be optimized.

FIG. 12 is a block diagram illustrating another set of embodiments, but where the feedback mechanism uses a hash engine and optional data correction engine specific to the interface. Rather than refer to the controller and the memory chip, FIG. 12 is presented in terms of the circuitry on the transmitter side 520 and the receiver side 530 since, as described further below, either one of these may be the controller and the other the memory depending on whether it is a read process or write process and the two sides need not be symmetric.

The transmitter side 520 will again include a write data buffer 521 and transmission interface circuitry 529. It will now also include a hash values generator 525 and a multiplexer 527. In a transfer process, the data to be written (523) is transferred out of the write buffer 520 to both the hash value generator 525 and the MUX 527. The hash value generator 525 correspondingly generates a hash value from the data, which is then also passed on to MUX 527. The multiplexer then supplies the data followed by its hash value to the transmission interface circuitry 529 and then onto the bus structure 550.

The receiver side again includes receiver interface circuitry and a read data buffer 535, plus some additional elements. After the read interface circuitry 532 takes the data and corresponding hash value off the bus 550, the de-multiplexing circuitry 533 separates the hash value from the data, the read data is sent to the buffer 535 and also to a receiver side hash value generator 539 that again generates a hash value from the data set. The receiver side generated hash value is then compared to the received hash value in the comparison circuitry 541. Depending on the embodiment, the result of the comparison can just determine whether these values match or further determine the amount of error due to the transfer process. A data correction engine 537 can also be included in some embodiments to correct interface errors without having to perform a data retransmission. In the exemplary embodiment, the hash generators (and the optional data correction engine on the receiver side) separate from ECC for used NAND core error, although there may be some overlap in circuitry; and, in fact, both may be implemented on the same logic circuitry of the controller but by different firmware code. (Although considered separate for this discussion, the two error detection/correction parts can also be interactive in a more general embodiment as described below.) Typically the hash value will be generated based on the entirety of the information being sent (user data, corresponding ECC, header information, etc.), but in alternate embodiments, it could be generated from just a portion by, say, stripping off the various overhead and just using the user data itself for generating the hash value.

FIG. 12 also includes feedback processing unit 560 connected to receive the output of the hash comparison circuitry 541. This feedback is then analyzed at 561, which, depending on the embodiment may consider one or more of temperature, supply voltage level, and the processing related quality of the NAND core. At 563 the results of this feedback can then be used to adjust the transmission process and is correspondingly connected to one or both of the transmission interface circuitry 529 and read interface circuitry 531. For a write operation (where the controller is the transmitter side), after a write transfer is issued from the controller to the memory device, the feedback processing unit may just read back the comparison of the generated hash values and by that determine the write-direction memory interface integrity. Based on this, interface write parameters may be modified and the process can be re-issued if desired. Symmetrically, the same operation may be employed to the read-direction where the memory is the transmitter side.

FIG. 13 is a diagram showing an example for transmitting the data and the generated hash value over the bus interface. As shown at top, the corresponding hash value is automatically appended to the data, so that these will be transmitted together when a device operates in this mode. In the second option, shown at bottom, the data payload is transmitted, the receiving side requests the corresponding hash value, which is then generated and transmitted. The data payload can be of predefined length or of random length. If data payload length is predefined then the hash value can be appended to the data, as in the first option, or sent on request. If data payload length is random, then the hash value can be send after issuing a specific command.

A number of variations are possible for the techniques and corresponding circuitry described with respect to FIG. 12. With respect the hash value engines and hash values, the hash engine may be parity code (cyclic redundancy check, or CRC), ECC, and so on. For example, a "binary" embodiment can be used that would return Pass/Fail, can be built based on Error Bit Count (CRC) and has the benefit of a low gate count to implement. Alternately, a "soft" embodiment can an return Error Bit Count (EBC), and optionally the locations of the failed bits, and can be built based on ECC codes such BCH or Reed-Solomon codes, providing more information to assist the system with accurate decisions. The hash engine may optionally also have a complementary feature of correcting the interface failures, for example similarly to the correcting flipped bits from the memory core, as represented by data correction engine 537 of FIG. 12. Based on the feedback from the transfer, the system may repeat the transfer. Transfer retry may be decided based on a binary transfer status or on a soft transfer status. Further, transfer retry may be decided based on a combination of transfer status and number of NAND bit flips; for example, if the interface introduced N errors and the NAND introduced M errors and the controller error correcting capability is P, and P>N+M, then the system may decide to not re-transmit.

The system can also be configured in various different ways. The configuration can be symmetric, where the hash engines at controller and memory sides are the same, or asymmetric. In an asymmetric configuration, different configurations are used for different transmission directions; for example, a faster mechanism can be designed for read transmissions while a more reliable mechanism is designed for the write transmissions. Also, it should be noted that even if the interface is configured symmetrically, as the settings may be changed during the interval between the initial write and subsequent read of the data, it may function asymmetrically with respect to a given set of data.

The feedback processing unit 530 may be variously located on the controller 100, on the memory 200, on both, or distributed between the two. In can also be formed on a separate circuit. In many applications, it will be most practical to implement the feedback processing unit on the controller, since the controller circuit often includes more advanced processing capabilities and also as memory system frequently of formed of multiple memory chips, but the techniques presented here are not so limited. In any of these variations, the checking for data transfer status phase is the responsibility of the feedback processing unit.

Considering further an example where the feedback processing unit is located on the controller side: in the read direction, after the controller reads the data and hash value, these will pass through the feedback mechanism and the controller will determine the pass/fail status and can adjust (or not) the interface setting accordingly. As the controller has already read the data and hash value, there is no further need of information from the flash side to determine the status, as this can be done in the controller's logic. In the write direction, the data payload and corresponding hash value are sent to the memory side and the controller can then operate in several different ways: Read the Pass/Fail status from the memory side; read back the hash value and determine Pass/Fail; read back the Error Bit Count (EBC) from the memory; read back the EBC and error locations from the NAND; or read Pass/Fail status and number of corrected bits from the memory side.

The feedback processing unit may decide to modify interface settings. For example the following interface settings may be modified: drive strength; bus frequency or other timing parameters; interface voltage; interface mode (e.g. switch from a Normal/Conventional-mode to a Toggle-mode); and so on. These interface settings may then be modified in an adaptive feedback fashion. As factors such as process variations, supply voltage levels, and temperature affect the likelihood of interface error, these factors can also be included as inputs to the feedback analysis 561 on FIG. 12.

The bus frequency and other parameter settings can be based on earlier remissions, with nominal parameter settings also being settable in various ways. For example, a Look Up Table (LUT) having different values for different bus capacitance/NAND configurations can be used. Such a Look Up Table (LUT) can also have different values for different operating process parameters, voltage supply levels, temperature, and so on. Process parameters, voltage supply levels, and temperature can also be a variable in a function (formula), instead of predefined in a LUT.

The interface settings optimization task may be operated in the background. Special events, such as voltage supply or temperature change, can also be used to trigger an interface settings training task. The interface training task may use also a known pattern transmitted across and not written to the NAND core, such as was described above with respect to FIG. 11 and path 437. Interface settings can also be different, and based on, read direction and write direction, or on different data retention requirements.

The preceding discussion has mainly considered the memory system as having a controller and a single memory device circuit. More generally, the system may include several memory chips that can be connected to the controller (and the feedback processing unit if a separate circuit) using various bus topologies. For example, all the memory chips may share a single system bus; or each memory circuit may have its own controller-memory bus; or various hybrid arrangements could be used. Different interface settings can then be applied to this plurality of NAND devices (e.g., if interfacing several devices, this could be done in parallel). Different interface setting can also be used based on the particular NAND device being accessed, as interface quality may be a function of the particular NAND device's load and/or cell/block quality). Further, within a given memory device, different interface setting can also be applied to the blocks within the NAND core, as interface quality may be a function of the particular block's quality.

More detail on the techniques of the forgoing section can be found in U.S. patent application Ser. No. 12/835,292 filed on Jul. 13, 2010, now U.S. Pat. No. 8,464,135.

Dynamic Optimization of Back-End Memory System Interface

This section will consider the controller-memory (or "back-end") interface of the memory system further and present some methods for dynamically optimizing the back-end read and write performance suitable for high-speed memory systems, including those with multiple memory data buses. As discussed above, a memory system is usually designed to have a certain amount of error tolerance; and although this error can arise both in the controller-memory transmission process and in actual on-memory storage process, traditionally only the last of these is considered for the ECC process and the back-end interface is typically optimized to eliminate, or at least minimize as far as possible, transmission channel error. In many cases, though, the data error resulting from the storage process (including read and write error) may be well below the ECC capabilities of the system. For example, although a heavily cycled device may need the full available data correction, a fresh device may have relatively little error, leaving the system with excess error correction capability. This section presents methods whereby the memory system internally allots a non-zero portion of this error correction capacity to the transmission channel. This allows for the interface to operate at, for example, higher speed or lower power, even though this will likely lead to transmission path error. When the memory portion requires a higher amount of error correction, the allotment can dynamically be adjusted. In complementary aspects, the system can calibrate transmission path to determine the amount of resultant transmission error for different operating parameters and then select the parameters based upon how much is to be allowed.

Considering the back-end interface between the controller and the memory section further, a typical memory system consists of a memory controller and a memory device, such as a NAND flash memory module. The back-end interface is the data bus between the memory and its controller. The interface is typically established in one of two ways. In the first, if the controller and memory devices are discrete components, the back-end interface is established by conducting traces on printed circuit boards (PCB), onto which these components are mounted. In the second, the controller and memory can be encapsulated in a single package, such as system-in-package (SIP) or multi-chip package (MCP). In this second case, the back-end interface is established by the package substrate.

Figure 14:
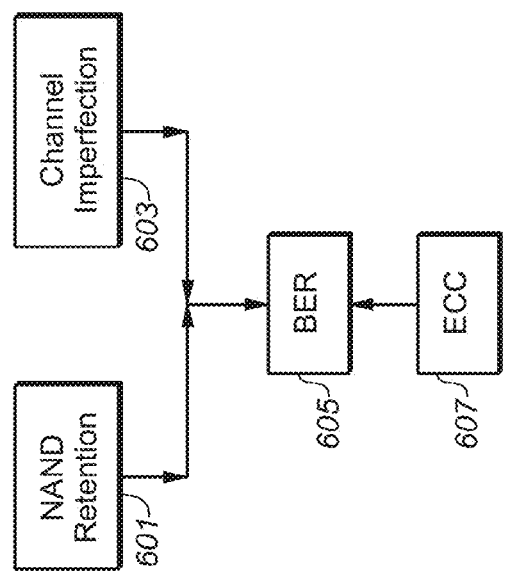
FIG. 14 schematically illustrates the contributions to the bit errors in a memory system.

As discussed in the previous section, the overall bit error rate (BER) in memory systems can be attributed to two main factors: the reliability of data retention in memory devices, such as NAND flash memory; and imperfection of back-end interface, which can causes transmission error. Error correction coding (ECC) can then be employed in memory systems to address this overall BER. FIG. 14 schematically illustrates the contributions to the bit errors in a memory system.

As shown in FIG. 14., one of the main sources of the overall bit error rate BER 605. The effect of this error, due to data degradation for the stored data (from charge leakage, disturbs and so on), as well as any error introduced in the read and write process, is shown as NAND Retention 601. Traditionally, the data correction is used to account just for this factor, which is observed when the data is read. Error due to channel imperfection is shown at 603 and affects both data read and write, but the impact will again be observed at read. The sources of the channel impaction error can include inter-symbol interference (ISI), same data bus (intra-bus) crosstalk, inter-bus cross talk (on multi-data buses designs), printed circuit board (PCB) noise, silicon die noise, package noise, and so on. On the other side, ECC 607 can correct error up to a certain level of error.

As the data transfer rate between the controller and the memory increases, the back-end interface becomes more susceptible to signal integrity related issues contributing to 603, such as crosstalk among signals within the same data bus (intra-memory data bus crosstalk) and inter-symbol interference (ISI). In addition, the introduction of memory topologies where controllers can access multiple memory devices simultaneously (multi-memory data buses design) subjects the back-end interface to simultaneously switching noise and crosstalk among data buses (inter-memory data bus crosstalk). In addition to bus speed, factors such as the voltage amplitude of the data bus and temperature (ambient temperature for PCB traces and junction temperature for system-in-package (SIP) or multi-chip package (MCP)) can also affect signal integrity of the back-end interface. Therefore, the intrinsic imperfections of the back-end interface becomes a bottleneck in determining overall system performance for high-speed memory systems. The pin capacitance of memory devices increases with the number of memory dies. High capacity memory devices constructed with multiple memory dies exhibit high capacitance on their data input/outputs (I/Os), which further degrades the edge rate and signal integrity of the data bus structure.

Signal integrity related issues on signal traces can be minimized by increasing the spacing the signal traces apart from one another to minimize crosstalk; but this approach is limited by the available area on the PCB or substrate. It can also be reduced by selecting PCB materials with low dielectric constant and low dissipation factor (loss tangent); but these PCB materials are more costly than the typical materials. So although there are ways to reduce this error with output lowering bus speed or otherwise degrading operating bus parameters, these ways suffer from drawbacks.

This section presents a dynamic optimization technique to address these signal integrity issues in the back-end interface and also account for process variations among controller and memory devices. In addition to process variations, the voltage settings and temperature under which the memory system operates may vary. A static solution does not account for variations in process, voltage, and temperature, and thus may not be the optimal approach.

This section uses a pseudo loop-back manner to dynamically optimize the back-end performance of memory systems, including those with multiple memory data buses. This can be done with the sort mechanisms similar to those described in the preceding sections or by using predetermined data pattern. The exemplary embodiment will use a pseudo-random bit pattern (PRBS). Dynamically optimizing the data bus settings can help to maximize the reliability of data transmission between the controller and the memory devices. This can allow the memory system to differentiate transmission error from error caused on the memory devices. These aspects can be particularly advantageous for products equipped with high-speed back-end memory interfaces and multiple memory data buses.

Conducting traces on PCB or package substrate have limited bandwidth, which causes inter-symbol interference (ISI). The effect of ISI depends on the edge rate (rise time and fall time), data rate, and data pattern. In digital communications, the pseudo-random bit pattern (PRBS) pattern is sometimes used to exploit the worst-case ISI impact of a data link because such pattern is rich in frequency components. A PRBS pattern is a repeating pattern that has properties similar to a random sequence and is used to measure jitter and eye mask of transmitted data in electrical data links. The PRBS is typically denoted as a $2^X$-1 PRBS or PRBS-X, where the power (X) indicates the shift register length used to create the pattern. Each $2^X$-1 PRBS contains every possible combination of X number of bits (except one). It is desirable to use the longest PRBS pattern practical as it exerts the greatest stress on the signal link and provides a better representation of random data.

Although the exemplary embodiment uses a pseudo-random bit pattern, other patterns can be used, as long as the system knows the pattern of the data set that was used so that this can be compared to the data that comes back at the end of the lop-back process. The exemplary embodiment uses the PRBS pattern because its random-like character can maximize the ISI impact of the signal link. In addition to the PRBS pattern, other types of data pattern can be utilized in this invention, and each individual pattern may generate a different result.

A PRBS pattern can be applied to each of the signal link in the parallel back-end interface. Ideally, although the pattern would be repeated infinitely, which is not practically feasible in the memory system, this should not be a major drawback provided that the pattern can be repeated a sufficient number of time by using a short pattern. For example, if the page size of a NAND flash memory is 16 kB, a PRBS-7 pattern with pattern length of 127 b can be repeated completely 129 times on each signal link of an 8-bit data bus. The remaining bit (16384b−127b×129=1b) constitutes an incomplete copy of the PRBS-7. This incomplete PRBS pattern at the end should not cause a significant as most of the transmission link effects are accounted for by the 129 cycles of complete PRBS pattern.

Figure 15:
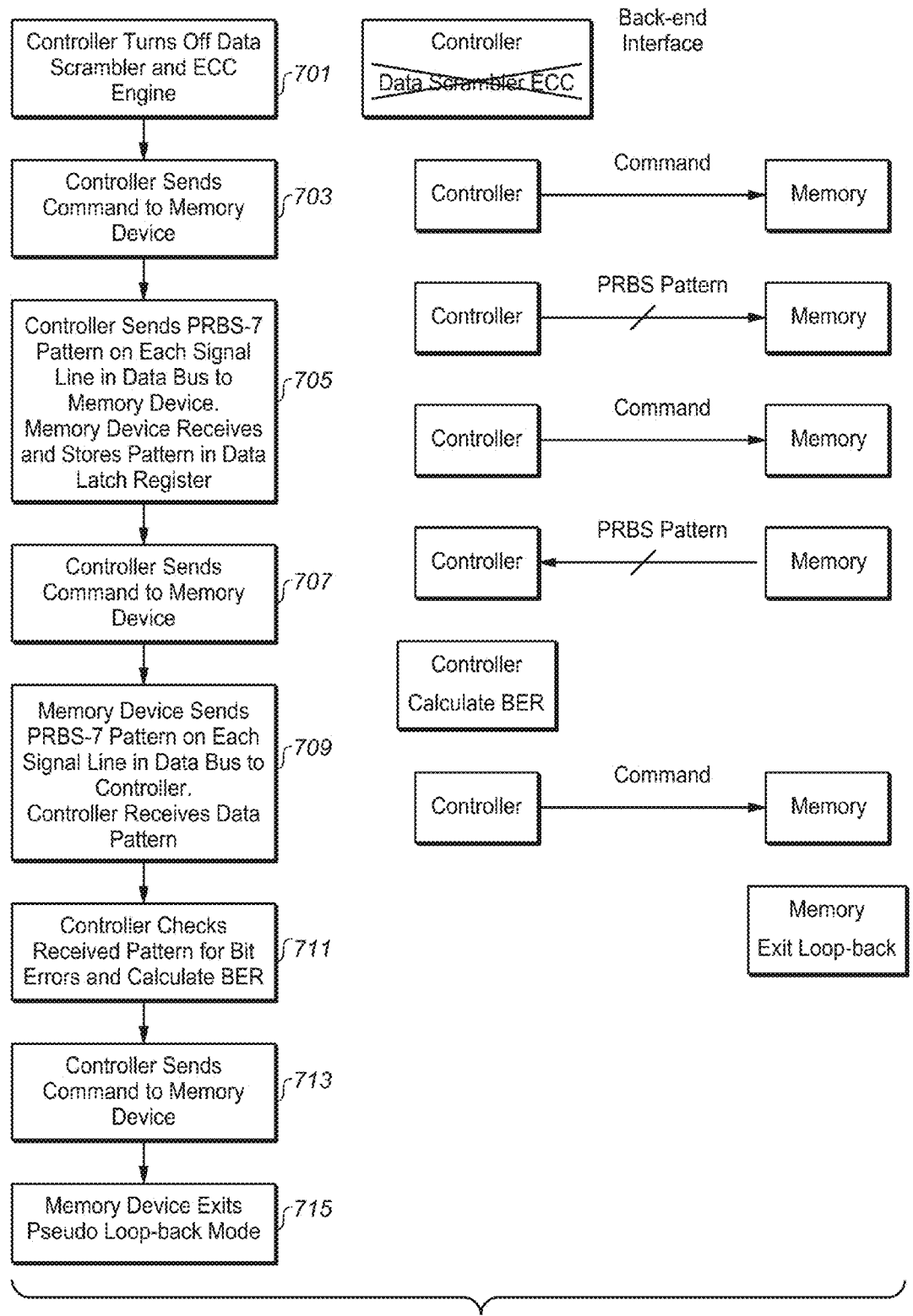
FIG. 15 can be used to illustrate the operation of a pseudo loop-back method in the back-end interface.

FIG. 15 can be used to illustrate the operation of a pseudo loop-back method in the back-end interface. In FIG. 15, the left hand side is a flow, with the right hand side schematically illustrating the corresponding controller-memory interactions. At 701, the controller turns off its data scrambling and error correction coding (ECC) capabilities, where on the right hand side, this is represented by these elements being X-ed out. Consequently, all data transferred out of and into the controller are in their raw format without any scrambling or correction. At 703, the controller sends a command to the memory device, telling it to store and hold the data to be received in its data latch register without transferring them to the memory cells. That is, there is no programming of this data set into the memory cells. At 705, the controller sends a known data pattern (here an independent PRBS-7 pattern) on each of the signal links in the data bus structure to the memory device. The memory device holds the data in the data latch register until it becomes full.

At 707, the controller sends a command to the memory device, telling it to send back the data stored in its data latch register continuously until the controller instructs it to stop. That is, after the data latch register has dumped all 16 kb of data on each link, it will start sending back the same data again. Thus, the PRBS-7 pattern repeats on each signal link of the data bus. The reason for the exemplary embodiment using the continuous operation of the PRBS pattern transfer is that bit error introduced by a signal link is a probabilistic event. The greater the amount of data transferred across a link, the more accurate and representative of the transmission bit error rate (BER) as a statistical measurement of the intrinsic link performance. At 709, the controller receives the repeating PRBS-7 pattern (or other used data pattern) on each signal link of the data bus.

At 711, the controller compares the received data to the sent data pattern (here the standard PRBS-7 pattern) and reports any error as transmission BER. The controller then sends a command to the memory device to stop sending the PRBS-7 pattern (713) and exit the pseudo loop-back mode (715).

Figure 16:
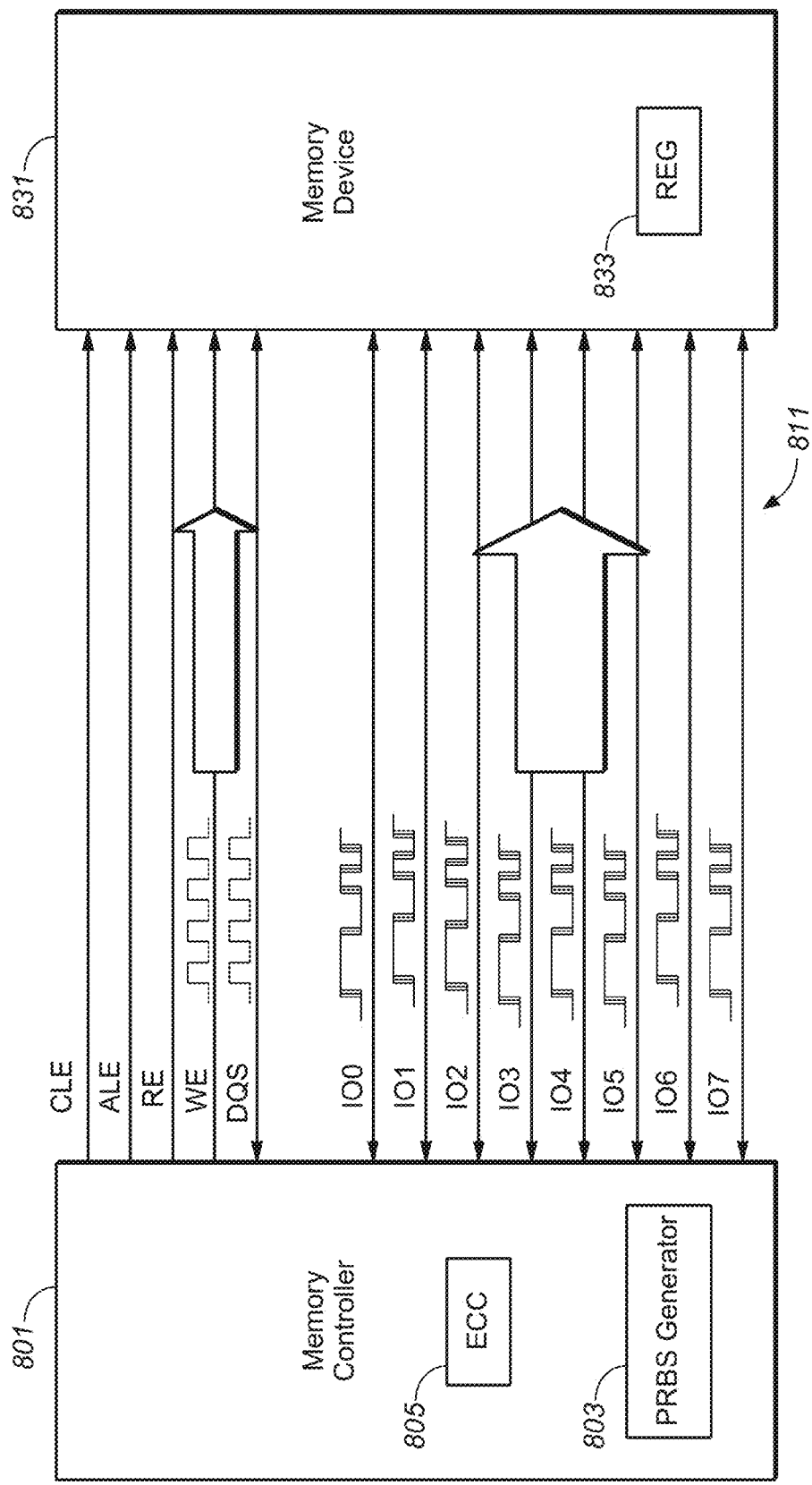
FIGS. 16 and 17 respectively correspond to blocks 705 and 709 of FIG. 15.
Figure 17:
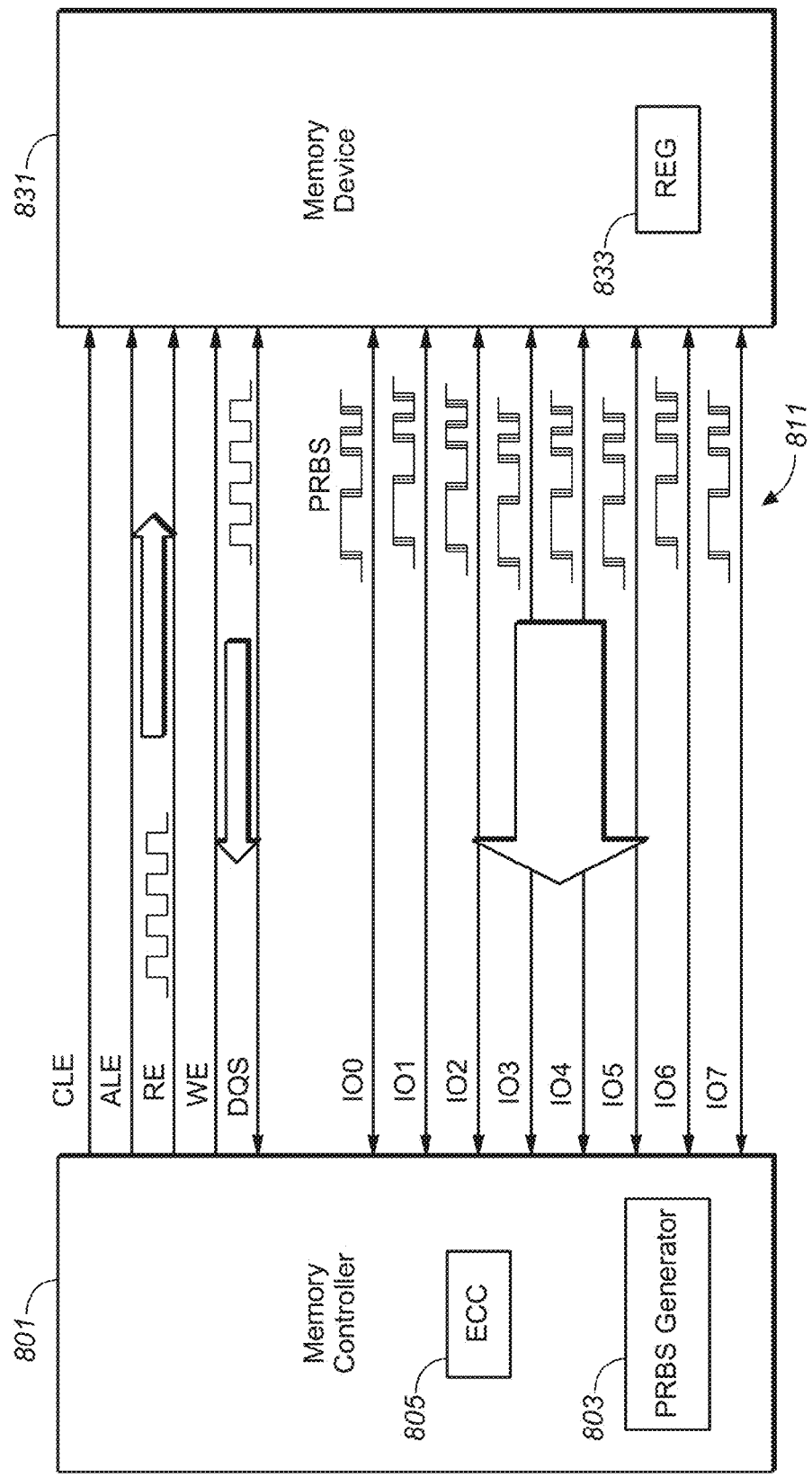

FIG. 16 corresponds to block 705 of FIG. 15 where the controller sends the data pattern memory device, with FIG. 17 corresponding to block 709. On these two figures, one particular example of a bus structure 811 is shown, where several lines are shown at top for command and control signals and a number of data lines shown below. Here, CLE=command latch enable, ALE=address latch enable, RE=read enable, WE=write enable, DQS=data strobe and there are eight input/output lines (IO0-IO7). These box diagrams are simplified for purposes of this discussion, with only an ECC block 805 and a PRBS generator 803 shown on the memory controller 801 and only the data register REG 833 is represented on the memory device 831, with other elements (including the non-volatile memory array on 831) not being explicitly shown. When the controller 801 is sending the data pattern across to the memory device 831 in FIG. 16, the write enable signal and the data strobe will be asserted and each signal line will carry the data pattern. Here, each IO line carries an independent pattern. Here, these are all individual copies of PRBS, but can have differing timing, as indicated by their relative skew in the figure. On the memory 831 the data pattern is then stored as received in the register 833. In FIG. 17 the data is sent back from the register 833 across the bus structure 811 to the controller 801, so the read enable signal and the data strobe are now asserted. Once on the data pattern has completed the round trip (without being written into the non-volatile memory) and is back on the controller 801, it can be checked against its original form and see how much corruption has occurred. Although the bus structure 811 is a parallel bus interface with multiple signal lines, this is just a particular example other bus structures can be used for the transmission channel, such as serial data arrangements.

The performance of a memory system is characterized by the data transfer rate (bus operating frequency) with respect to power consumption, which is directly related to the data bus voltage. By varying the voltage amplitude of the data bus (determined by the I/O of the device driving the data bus) and the data transfer rate, a 3-dimensional representation as a shmoo plot can be created with the transfer rate plotted along the x-axis, data bus voltage along the y-axis, and transmission BER along the z-axis. Here, the data transfer rate can refer to either the one applied during write operations, as in 705 of FIG. 15, when data is transferred from the controller circuit to the memory circuit, or to the read operation, as in 709, when data is transferred from the memory to the controller. The data represented in such a shmoo plot can be measured at various output drive impedance (drive strength) and temperatures to cover the worst-case, typical, and best-case scenarios. As a result, for a given amount of allowable transmission error, the optimal point of operation can be determined at a given combination of parameters such data bus voltage, output drive impedance, slew rate, line capacitance, transfer rate, temperature, and power consumption. An example of the shmoo plot is shown in FIG. 18.

Figure 18:
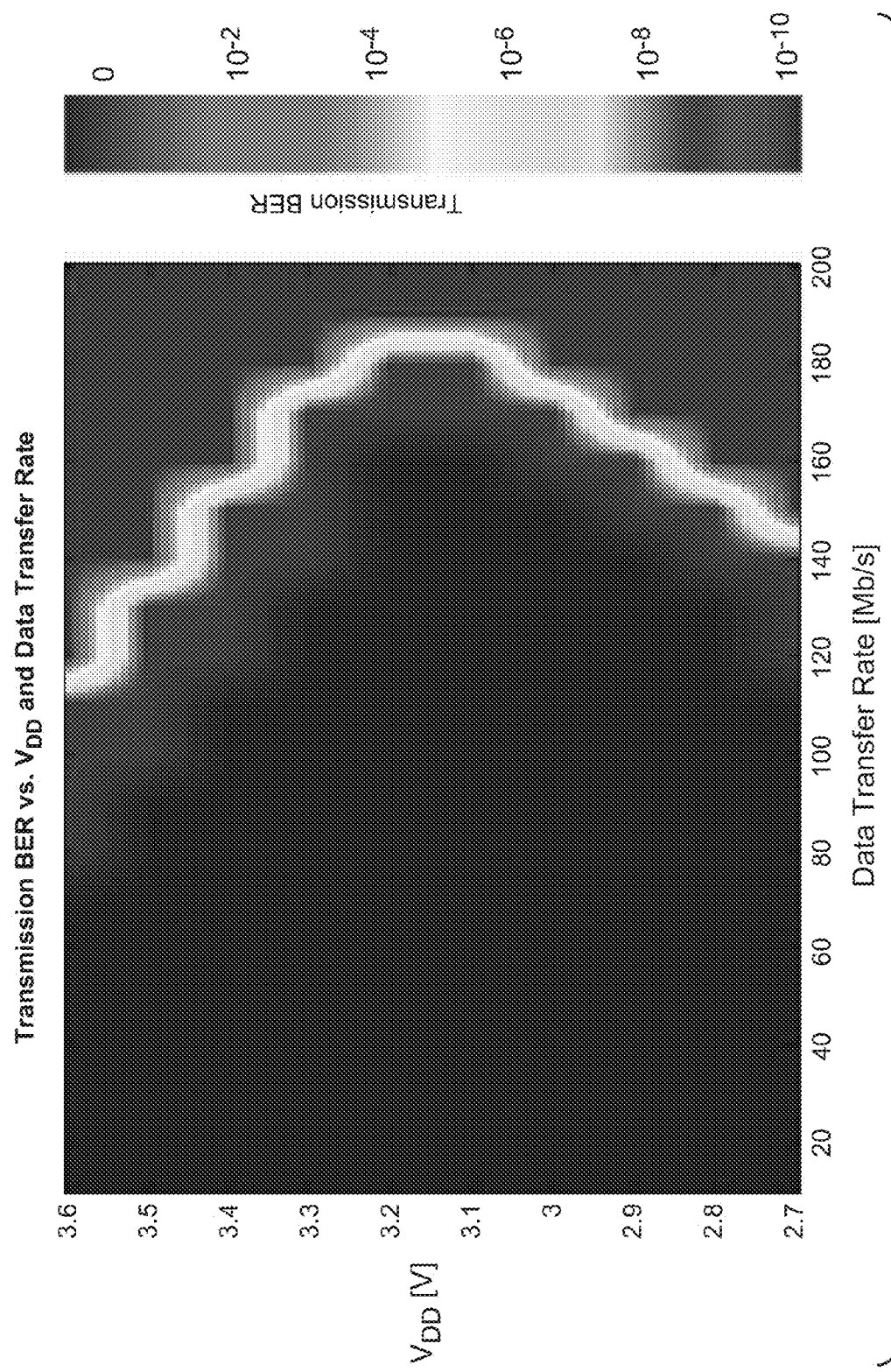
FIG. 18 is an example of a shmoo plot showing transmission BER vs. data bus voltage and data transfer rate.

FIG. 18 is an example of a shmoo plot showing transmission BER vs. data bus voltage and data transfer rate at a fixed output drive impedance, slew rate, line capacitance, and temperature for a particular example of a memory system. The data bus voltage is $V_{DD}$ on the vertical axis and the transfer rate on the horizontal. The amount of transmission BER is represented by color on the graph, with the key on the right of the figure. In this black and white representation the representation of very low and very high error amount appear the same, but the lower error region in the main figure is to the left of the light-colored dividing regions, with the higher error regions to the right. Based on this sort of data, for amount of allowed transmission data, a combination of operating parameters can be selected, where, as usual, this will often involve a trade-off. For example, if the desired amount of allowable BER is $10^{-5}$, if maximum speed is the primary concern, $V_{DD}$ would be taken about 3.1-3.2 V, allowing a transfer rate of about 170-180 Mb/s. If power consumption is a more important concern, a lower $V_{DD}$ value could be used, say 2.8 V, would then allow a transfer rate of about 150 Mb/s for about the same transfer BER. If the BER allocated to the transmission channel is re-allotted to a different value, based, for example, on the how much the memory has cycled or the ECC indicating that the combined contributions to the BER are approaching the maximum capabilities of the system, the operating parameters for the bus system can then be adjusted by the controller based on this data.

Consequently, after calibrating the system by capturing the data represented in the shmoo plots at various output drive impedance, slew rate, line capacitance, temperature and so on, the memory system can operate according to various cases. For example, given a desired transmission BER, the memory system looks up and selects the optimal data bus voltage, data transfer rate, output drive impedance, and slew rate. (This data from the calibration process can be kept in either the non-volatile memory or in the memory space (RAM) in the controller circuit.) For example, it may select the lowest data bus voltage, highest data transfer rate, and lowest output drive impedance that result in the desired transmission BER. In another example, given a particular combination of data bus voltage, data transfer rate, output drive impedance, slew rate, line capacitance, and temperature, the memory system knows what transmission BER it can expect. Alternately, the memory system may select an operating condition that balances all factors—data bus voltage, data transfer rate, output drive strength, and transmission BER.

Since the design of the I/O buffers in the controller and the memory device may be different, the optimal read and write performance of the memory system can be determined separately. In addition to the differences resulting from differing memory system design, there will also be differences for individual examples of the same device, due to process variations as well as by differences in operating conditions. To account for device aging, changes in operating conditions, and so on, the calibration process can also be repeated. For example, an initial calibration could be performed before the device is shipped at test time, and then the controller could recalibrate system periodically or in response to an event, such as device cycling, error results, notable changes in operating conditions, and so on. Thus, in addition to change the proportion of total error allotted to the transmission channel, the corresponding operating parameter for a given allocation may change dynamically.

As noted above, performance can be optimized during both the read and write processes. Going back to FIG. 15, for performance optimization during memory read, at 705 the system slows down the transfer rate of the data pattern being written into the memory device's data latch register to maximize the integrity of the transfer for the data pattern. For example, at 10 MHz transfer rate, it will take 1.6 ms to fill up a 16 kb data latch register. At 709 and 711, the system measures the transmission BER incurred during the read operation where the memory device's I/O is the driver and the controller is the receiver. The shmoo plot data then show the relationship between the memory device's I/O voltage and the read frequency.

For performance optimization during memory write, at 705, the system varies the voltage and transfer rate of the data pattern being written into the memory device's data latch register. At 709, the system will then slow down the transfer rate of the data from memory device to controller to prevent injecting additional bit errors by the signal link. The transmission BER measured is then the one incurred during the write operation in 705. The shmoo plot data will consequently represent the relationship between the controller's I/O voltage and the write frequency.

So far, the various aspects presented here have been presented in a context where this is only a single bus between a controller circuit and a single memory circuit. However, a memory system may include multiple devices with various bus topologies; and when there are multiple busses, interactions between these busses can lead to additional sources of error. The techniques here can provide the ability to skew each of the signal links within a data bus in the back-end interface to a specified resolution, for example, 100 ps. Such skewing capability can be introduced by either the controller or the memory device in either the driver or the receiver. Introducing skew into the data bus allows the system to compensate for length mismatch of the signal traces in the PCB or package substrate. Introducing skew can reduce the impact of near-end and far-end crosstalk in the back-end interface and, consequently, lower the transmission BER. Two types of crosstalk are involved: intra-memory data bus crosstalk; and inter-memory data bus crosstalk. Such crosstalk causes jitter in the data bus. A typical memory system uses the clock sent by the driver to sample each individual signal in the parallel data bus at the same moment. Thus, an increase in jitter on each signal in the data bus will cause an increase in transmission BER. By skewing the data across multiple memory data buses so that they do not align relative to one another, inter-memory data bus cross talk can be reduced.

Figure 19:
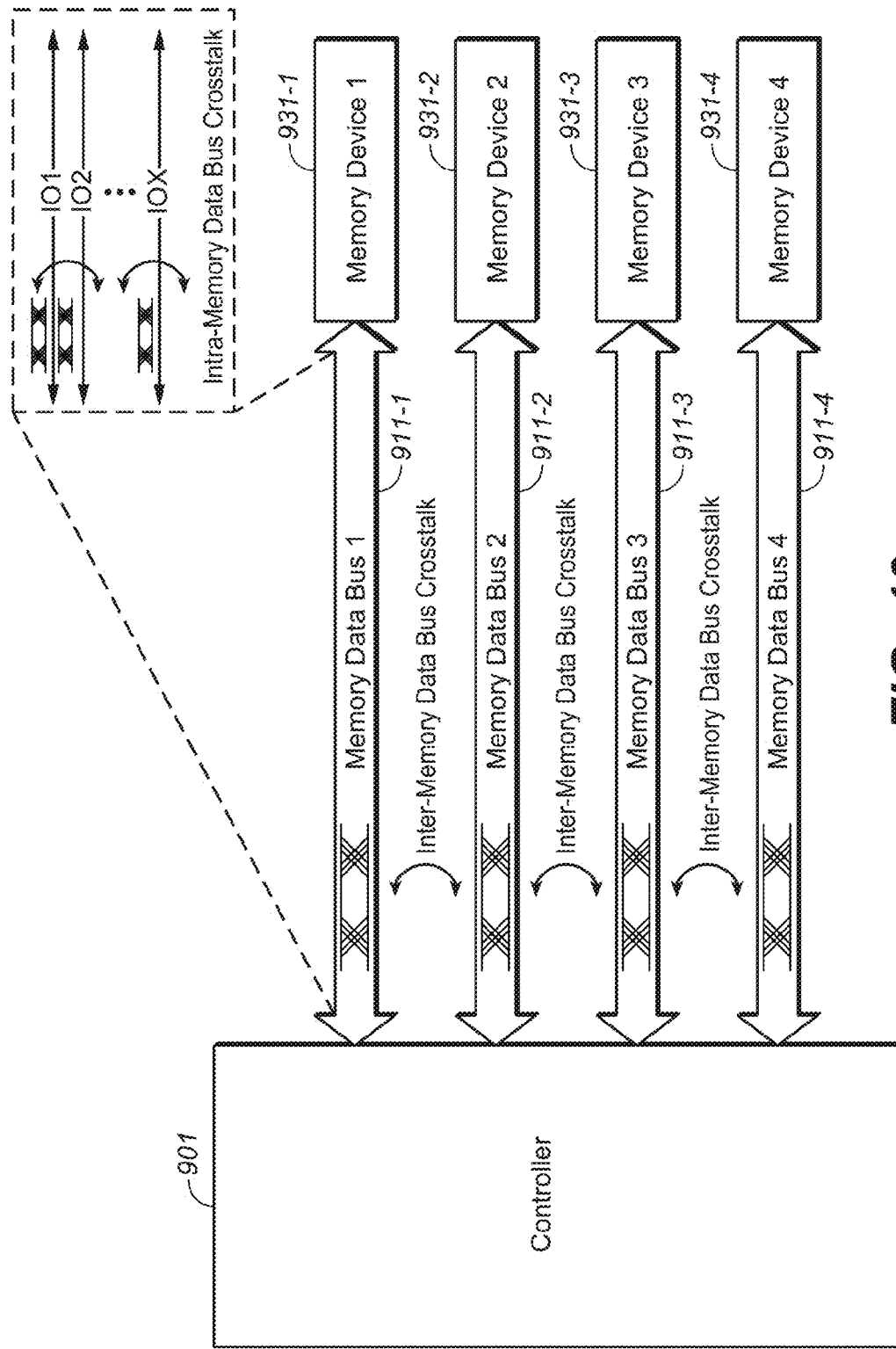
FIG. 19 is a block diagram that illustrates this crosstalk in a memory system whose bus structure uses multiple memory data buses.

FIG. 19 is a block diagram that illustrates this crosstalk in a memory system whose bus structure uses multiple memory data buses. The memory system includes controller 901 and the multiple, here four, memory devices 931-1, 931-2, 932-3, 934-4 that are connected to the controller through respective busses 911-1, 911-2, 911-3, 911-4. For each of the busses 911, they will have one or more I0 lines as shown in the derail as IO1 to IOX. As before, these individual buses can various numbers of IO lines operated in a parallel, serial, or a combination of these for the transfer of data. This sort of multi-bus arrangement is often implemented in SSD type devices (see, for example U.S. Pat. No. 7,376,034, U.S. Pat. No. 7,765,339, or the paper "A High Performance Controller for NAND Flash-based Solid State Disk (NSSD)" Park et al, Samsung, Non-volatile Semiconductor Workshop, 2006, IEEE, NVSMW 2006, 21$^{st}$, vol. no., pp. 17-20, 12-16 Feb. 2006) in order to improvement performance, but is also found in the design of some memory cards and other memory systems. In addition to the sort of intra-memory data bus cross talk between the IO lines of a given bus, there will also now be inter-memory data bus crosstalk signal on the different busses. When combined with the use of the PRBS pattern and pseudo loop-back mode described above, the optimal skew that generates the least crosstalk, and consequently the lowest transmission BER, can be determined given a certain combination of data bus voltage, transfer rate, temperature, output drive impedance, slew rate, line capacitance, and power consumption.

The various aspects presented here provide a low-cost solution that optimizes the back-end interface performance under the presence of various signal integrity issues. By dynamically allotting "unused" ECC capability to the transfer process, the performance can be improved as described. As noted above, some memory systems use a type of "strong" ECC that exploits the properties of multi-state memory devices, in which case the error correction capabilities transferred for use of the transmission channel may not transfer in a 1 to 1 fashion. It should also be noted that although the memory system incorporates ECC to compensate for data error, there is typically not the same provision for commands and the memory device will often not accept corrupted commands, so that although error may intentionally allowed in the transmission of data, this will not be the case for commands. Consequently, although a higher transfer rate may be allowed for the data by these mechanisms, a slower, safer setting for the transfer rate (or other parameters) can be incorporated so that no error is incurred for the control signals.

More detail on the techniques of the forgoing section can be found in US patent publication number US-2012-0266048-A1.

Two-Level CRC in the Controller

To return user data to the host uncorrupted, data error needs to be removed for all stages of transfer and storage. The previous sections have looked at the transfer of data between the controller and memory circuits. This section looks at the problem of corruption in the controller as data moves between the host interface to the memory circuits.

In the controller circuit, cyclic redundancy check, or CRC, can be used to cover some of the problems that result in data error. For example, as the internal bus frequency increases to increase performance, the probability of bit flips internal to the controller increases. Bit flips can also occur in RAM memory. Firmware algorithm error can also occur.

One approach to using CRC on the controller is for the CRC to be generated and checked at entry only. Under this sort of arrangement, the CRC is generated on write at the host interface side of the controller, the CRC (which acts as metadata) travels with the host data through the many elements within the controller, and is stored into the memory array for later reading. This can be illustrated with respect to FIG. 20. A host 1001 sends data to a memory system 1003 where it is received at the host interface 1011 of controller 1010. Between the host 1001 and the memory system 1003 the data will typically be protected by some sort of CRC, allowing the integrity of the data across the host-memory link to be checked and, if required, the data sent can be re-sent. (In the following, CRC will be used generically for the check values/ redundancy codes used to protect the associated data, including the sort of hash values and ECC discussed above.) Once the data is on the memory system 1003 at the host interface 1011, associated CRC is generated and can travel with the data through the controller 1010, across the memory interface 1013 and on to the memory circuit 1020 to be stored on the array 1021.

When the data is read back from the array to the host, the CRC can be manipulated through the data path and checked just before the data is sent back to the host. Under this arrangement, the CRC has to be stored on the memory. Also, complex algorithms (such as encryption and bit scrambling) make it difficult for the CRC to be checked at the controller's memory interface, so that that failures cannot be caught on the host write path, but, instead the error is the only be checked on the read path. For example, on the write data path in the controller 1010, after leaving the host interface 1011, a data set along with its associate CRC travels through the encryption block 1015 and are both encrypted, at which point the CRC can no longer be used to readily check the data set. Only once the data has been brought back through block 1015 and decrypted on the read path can the data be checked. Consequently, any error that arose in, say, the encryption process would not be apparent until this point. If, instead, the error could be detected at various stages of the write path in the controller, if corrupted data were found it could be re-requested from the host while it is still available, rather than when it is too late to be useful. Similarly, on a read (or data relocation) operation, corrupted data could be re-request from the memory.

Another approach is for CRC to be generated and checked at both sides, where the CRC is generated on write at the host interface side of the controller and the CRC is generated after, say, the data is encrypted. Although the CRC can be checked at the controller's memory interface, this requires that the data scrambling algorithm is replicated at the flash interface in order to test the CRC. While this is feasible for simple scrambling algorithms, it becomes expensive for more involved algorithms such as heavier compression, complex data encoding, or complex scrambling, as is found in "strong" EEC, or SECC (see references cited above). Testing the data only at two points can catch a problem on write, but in other cases this can result in the data being lost. Also, if complex coding algorithms are used, then they are typically done close to the host interface and any subsequent bit-flips are not covered by the CRC engine.

Figure 20:
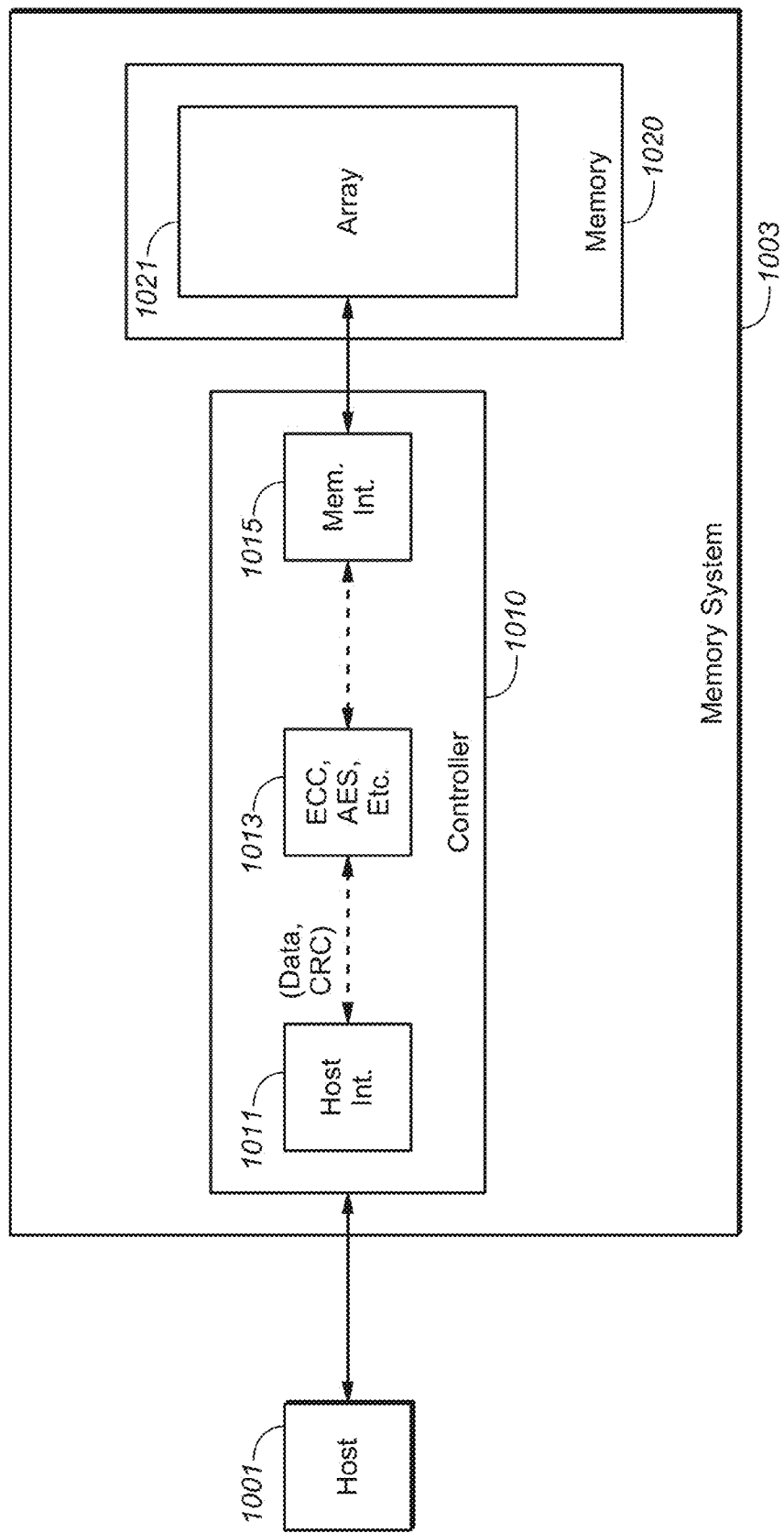
FIG. 20 illustrates a first level of CRC within the memory controller.

The sort of arrangement illustrated with respect to FIG. 20 can be considered a first layer of CRC. As noted, if during a write command the data is corrupted in the portion of the data path between the host and the ECC engine, it is not protected by ECC and hence not detected until a host read. At this point in time, it is too late to try and recover the data. A read error is flagged back to the host. This section introduces a complimentary, second layer of CRC on the controller than be in addition to, or instead of, this first layer. The algorithms of the exemplary embodiment aims at solving this problem by finding flip-bits during a write (or other data transfer in the controller) and attempting to recover the data from the previous storage point (such as a write cache buffer) or flagging the error back to the host immediately.

Figure 21:
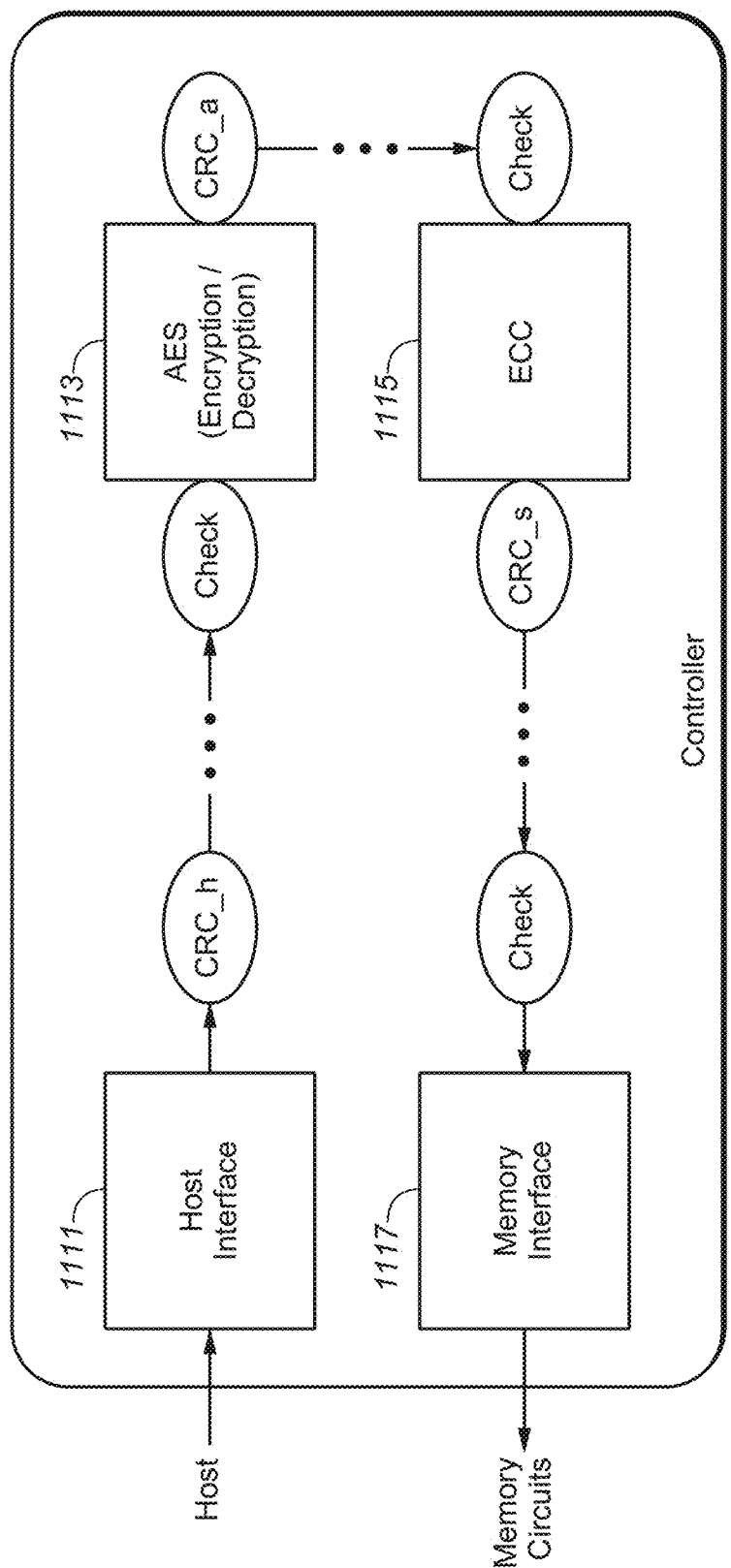
FIG. 21 illustrates an example of the use of a second, internal level of CRC in the controller.

More specifically, to implement an End-to-End CRC for the controller, and find intermediate faults at the internal transfers, multi-level CRC is used. A first level CRC can generated by the host interface and is followed through all the way to the memory array. A second level of CRC can be generated and checked as the data goes through the different resources in the controller, such as an encryption block (such as based on AES (Advanced Encryption Standard), for example) or ECC, through which the data travels. As soon as the data is manipulated, a new CRC can be generated so it can track the data correctly along the stage of the data path. FIG. 21 shows an example of the points at which temporary CRCs can be generated for the write path.

FIG. 21 is a schematic representation of process for the write path through the some of the functional block of the controller. The explicitly shown functional blocks in this example are the host interface 1111, an encryption/decryption (here AES) block 1113, an ECC block 1115, and a memory interface 1117. In a typical write operation, a set of host data would be received at the host interface 111 and pass successively through these blocks and the onto a memory circuit. There of course can be, and typically will be, other blocks on the controller that are not shown here, such as those described in earlier sections. For example, controller circuits incorporate RAM memory, such as DRAM, SRAM, or both, where data can be stored. Thus, between the host interface 1111 and the AES block 1113 the data (along with any associated CRC) may be buffered in DRAM, where checking for any bit flips while in DRAM would be part of the next downstream CRC check. Also, although FIG. 21 is represented as a set of discreet blocks, it will be understood the various functional blocks can be implemented according to various hardware/software/firmware embodiments and combinations of these, so that circuitry may in some cases be shared between blocks.

This arrangement allows for some or all of the functional blocks of the controller, particularly those that transform the data (such as encryption or data scrambling), the resource can check the incoming CRC (added by the previous resource) and generates a new one as data goes out. Referring to the controller's internal read data path and the different sets of CRC as shown in FIG. 21, there is a CRC h generated at the host interface 1111. This is checked at the input of the encryption/decryption engine 1113.

As data gets manipulated by the AES block 1113, it generates CRC_a. The data then reaches the ECC engine 1115, at the input of which CRC_a is checked. As the data is manipulated, CRC_s is generated that can then be used to check whether internal transfer to the next stage of the controller, here the memory interface, lead to any data corruption. Within the SSECC, CRC_s could be split into 2 steps. The first step can be termed CRC_s1, is generated after the scrambling (on both the header and data sections), the second step is after the encode process completes, checks the data for CRC_s1, and then creates a new CRC (termed CRC_s2) that covers the data and metadata (header+parity). The CRC_s2 is checked at the flash interface. In effect, the CRC generators at every point in the data path are chained together so as soon as data is manipulated, a CRC is generated and tracks it. After the ECC engine, CRC_s can used to cover the generated ECC code words.

The ECC can be of the low density parity code (LDPC), BCH, Reed-Solomon or other code type, including strong ECC (SECC) variants discussed in the references cited in earlier sections. For any of these variants, the ECC can be implemented in various ways. In a more basic version, the ECC can be handled transparently, where the data comes in, the data comes out, and some parity bytes can be attached. Other engines can do encoding of the data to transform the data into patterns that lend themselves to the structure of the memory circuit, as in strong ECC embodiments. Another ECC engine sub-block can do random scrambling of the data to mix all the bits to avoid any patterns. These latter embodiments change the input from the output and are examples of where the techniques of this section can be particularly of use.

A number of variations and options can be used within this sort of multi-layer CRC for the internal transfers of data within the controller. In the exemplary embodiments, the intermediary CRC (such as CRC_h) can be discarded at the AES block 1113 after being used to check the data, although it could alternately continue to travel the data path with the data with which it is associated. Also, it is something of a design choice as to which blocks check the data with the incoming data with the attached CRC and then attach a new set of CRC on the way out. The focus here is on the internal functional blocks that transform the data (such as those involving encryption or scrambling) in a way that would subsequently make it difficult to use any associated CRC: for example, in FIG. 21 the host interface 1111 generates CRC_h that then travels to the AES block 1113 before being checked; alternately, the data (and CRC_h) will typically be buffered in, say, DRAM (not shown) between these blocks, but not checked and have newly generated CRC attached, although it could.

Further, the discussion with respect to FIG. 21 is based on the write path, but a similar arrangement can be used for the read path for data going from the memory section, through the controller, and on to the host, where the checking and generating of internal CRC reversed correspondingly relative to FIG. 21. For data relocation operations, such as would occur during a garbage collection where data is transferred from the memory to the controller, checked/corrected at the ECC block, and then written back to the memory, the technique can similarly be applied: For example, in a data relocation operation, a CRC_m can cover the data from the memory interface to the ECC block, and CRC_s would then cover the data on the return trip.

For any of the embodiments described, the techniques of this allow for data transformation in the controller resources tracked, providing end to end CRC integrity. Both on their own and combined with the techniques of the preceding section, these can help to improve data integrity across the whole of the memory system.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A non-volatile memory system, comprising:
   one or more non-volatile memory circuits; and
   a controller circuit having a plurality of functional blocks, including:
     a host interface through which the non-volatile memory system is connectable to a host for transferring user data therebetween;
     a memory interface through which the controller circuit is connected to one or more of the non-volatile memory circuits for transferring the user data therebetween; and one or more intermediate blocks through which data passes when being transferred between the host and memory interfaces,
   wherein when transferring a data set from a first functional block of the plurality of functional blocks through a second functional block of the plurality of functional blocks, prior to transmitting the data set therefrom the first functional block generates a first associated redundancy code that is transmitted therefrom with the data set, after receiving the data set and the first associated redundancy code at the second functional block and prior to operating on the data set therein the second functional block checks an integrity of the data set using the first associated redundancy code, and subsequent to operating on the data set in the second functional block and prior to transmitting the data set therefrom the second functional block generates a second associated redundancy code that is transmitted therefrom with the data set.

2. The non-volatile memory system of claim 1, wherein the transferring the data set from the first functional block through the second functional block is performed as part of a write operation.

3. The non-volatile memory system of claim 2, wherein the first functional block is the host interface.

4. The non-volatile memory system of claim 1, wherein the transferring the data set from the first functional block through the second functional block is performed as part of a read operation.

5. The non-volatile memory system of claim 4, wherein the first functional block is the memory interface.

6. The non-volatile memory system of claim 1, wherein the transferring the data set from the first functional block through the second functional block is performed as part of a data relocation operation.

7. The non-volatile memory system of claim 6, wherein the first functional block is the memory interface.

8. The non-volatile memory system of claim 1, wherein the controller circuit further includes:
   a volatile memory, wherein when transferring the data set and the first associated redundancy code from the first functional block to the second functional block, the data set and the first associated redundancy code are stored in the volatile memory prior to being received at the second functional block.

9. The non-volatile memory system of claim 1, wherein the operating on the data set by the second functional block includes transforming values of the data set.

10. The non-volatile memory system of claim 1, wherein the second functional block is an error correction code (ECC) block that operates on the data set by forming the data set into ECC code words, wherein the second associated redundancy code covers the EEC code words.

11. The non-volatile memory system of claim 1, wherein the first and second functional blocks are first and second sub-blocks of an error correction code (ECC) block, wherein the first sub-block operates on the data set by forming the data set into ECC code words and the second sub-block operates on the data set by scrambling an assignment of output values relative to input values, and wherein an associated redundancy code generated by the first sub-block covers the EEC code words.

12. The non-volatile memory system of claim 11, wherein the forming of the data set into the ECC code words is based on one or more properties related to how data is written into the one or more non-volatile memory circuits.

13. The non-volatile memory system of claim 1, wherein the second functional block is an encryption block that operates on the data set by encrypting the data set.

14. The non-volatile memory system of claim 1, wherein the one or more non-volatile memory circuits each have one or more arrays of non-volatile memory cells, wherein each of the one or more arrays is a three dimensional memory array monolithically formed as a plurality of physical levels of memory cells and has a physical level with an active layer disposed above a silicon substrate, and wherein the non-volatile memory cells are in communication with operating circuitry.

15. A method of operating a controller circuit in a non-volatile memory system, the memory controller having a plurality of functional blocks including a host interface, a memory interface, and one or more intermediate blocks through which data passes when transferred between the host and memory interface, the method comprising:
generating, for a data set, a first redundancy code at a first functional block of the plurality of functional blocks;
transmitting the data set and the first redundancy code from the first functional block to a second functional block of the plurality of functional blocks;
receiving the data set and the first redundancy code at the second functional block;
checking an integrity of the data set using the first redundancy code at the second functional block;
operating on the data set in the second functional block after checking the integrity of the data set;
generating a second redundancy code at the second functional block after operating on the data set; and
transmitting the data set and the second redundancy code from the second functional block.

16. The method of claim 15, further comprising:
prior to generating the first redundancy code, receiving the data set at the host interface in communication with a host device.

17. The method of claim 16, wherein the first functional block is the host interface.

18. The method of claim 16, further comprising:
in response to the checking the integrity of the data set, determining that the data set is corrupted and requesting the host device re-supply the data set.

19. The method of claim 15, further comprising:
prior to generating the first redundancy code, receiving the data set at the memory interface in communication with a memory circuit.

20. The method of claim 19, wherein the first functional block is the memory interface.

21. The method of claim 19, further comprising:
in response to determining that the data set is corrupted, requesting the memory circuit re-supply the data set.

22. The method of claim 19, wherein the memory circuit has one or more arrays of non-volatile memory cells, wherein each of the arrays is a three dimensional memory array monolithically formed as a plurality of physical levels of memory cells and has a physical level with an active layer disposed above a silicon substrate, and wherein the non-volatile memory cells are in communication with operating circuitry.

23. The method of claim 15, further comprising:
subsequent to transmitting the data set and the first redundancy code from the first functional block and prior to receiving the data set and the first redundancy code at the second functional block, storing the data set and the first redundancy code in a volatile memory on the controller circuit.

24. The method of claim 15, wherein the operating on the data set by the second functional block includes transforming values of the data set.

25. The method of claim 15, wherein the second functional block is an error correction code (ECC) block that operates on the data set by forming the data set into ECC code words.

26. The method of claim 15, wherein the first and second functional blocks are first and second sub-blocks of an error correction code (ECC) block, wherein the first sub-block operates on the data set by forming the data set into ECC code words and the second sub-block operates on the data set by scrambling an assignment of output values relative to input values, and wherein a redundancy code generated by the first sub-block covers the EEC code words.

27. The method of claim 26, wherein the forming of the data set into the ECC code words is based on one or more properties related to how data is written into the non-volatile memory system.

28. The method of claim 15, wherein the second functional block is an encryption block that operates on the data set by encrypting the data set.

29. A controller circuit for a non-volatile memory system, the controller circuit having a plurality of functional blocks including:
a host interface through which the non-volatile memory system is connectable to a host for transferring user data therebetween;
a memory interface through which the controller circuit is connectable to one or more memory circuits for transferring the user data therebetween; and
one or more intermediate blocks through which the user data passes when being transferred between the host and memory interfaces,
wherein when transferring a data set from a first functional block of the plurality of functional blocks through a second functional block of the plurality of functional blocks, prior to transmitting the data set therefrom the first functional block generates a first associated redundancy code that is transmitted therefrom with the data set, after receiving the data set and the first associated redundancy code at the second functional block and prior to operating on the data set therein the second functional block checks an integrity of the data set using the first associated redundancy code, and subsequent to operating on the data set in the second functional block and prior to transmitting the data set therefrom the second functional block generates a second associated redundancy code that is transmitted therefrom with the data set.

30. The controller circuit of claim 29, wherein the transferring the data set from the first functional block through the second functional block is performed as part of a write operation.

31. The controller circuit of claim 30, wherein the first functional block is the host interface.

32. The controller circuit of claim 29, wherein the transferring the data set from the first functional block through the second functional block is performed as part of a read operation.

33. The controller circuit of claim 32, wherein the first functional block is the memory interface.

34. The controller circuit of claim 29, wherein the transferring the data set from the first functional block through the second functional block is performed as part of a data relocation operation.

35. The controller circuit of claim 34, wherein the first functional block is the memory interface.

36. The controller circuit of claim 29, wherein the controller circuit further includes:
a volatile memory, wherein when transferring the data set and the first associated redundancy code from the first functional block to the second functional block, the data set and the first associated redundancy code are stored in the volatile memory prior to being received at the second functional block.

37. The controller circuit of claim 29, wherein the operating on the data set by the second functional block includes transforming values of the data set.

38. The controller circuit of claim 29, wherein the second functional block is an error correction code (ECC) block that operates on the data set by forming the data set into ECC code words.

39. The controller circuit of claim 29, wherein the first and second functional blocks are sub-blocks of an error correction code (ECC) block, wherein a first of the sub-blocks operates on the data set by forming the data set into ECC code words and a second of the sub-blocks operates on the data set by scrambling an assignment of output values relative to input values, and wherein an associated redundancy code generated by the first of the sub-blocks covers the EEC code words.

40. The controller circuit of claim 39, wherein the forming of the data set into ECC code words is based on one or more properties related to how data is written into the non-volatile memory system.

41. The controller circuit of claim 29, wherein the second functional block is an encryption block that operates on the data set by encrypting the data set.

* * * * *